(12) United States Patent
Mizukami

(10) Patent No.: US 8,841,683 B2
(45) Date of Patent: *Sep. 23, 2014

(54) SEMICONDUCTOR RECTIFIER DEVICE

(75) Inventor: Makoto Mizukami, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 102 days.

This patent is subject to a terminal disclaimer.

(21) Appl. No.: 13/220,107

(22) Filed: Aug. 29, 2011

(65) Prior Publication Data

US 2012/0223333 A1 Sep. 6, 2012

(30) Foreign Application Priority Data

Mar. 3, 2011 (JP) ................................. 2011-045935

(51) Int. Cl.

| | |
|---|---|
| *H01L 29/15* | (2006.01) |
| *H01L 29/16* | (2006.01) |
| *H01L 29/872* | (2006.01) |
| *H01L 29/66* | (2006.01) |
| *H01L 29/20* | (2006.01) |
| *H01L 29/06* | (2006.01) |
| *H01L 29/43* | (2006.01) |

(52) U.S. Cl.
CPC ........... *H01L 29/872* (2013.01); *H01L 29/2003* (2013.01); *H01L 29/0692* (2013.01); *H01L 29/1608* (2013.01); *H01L 29/1602* (2013.01); *H01L 29/6606* (2013.01); *H01L 29/0619* (2013.01); *H01L 29/43* (2013.01)
USPC ............... 257/77; 257/76; 257/409; 257/452; 257/E29.338; 257/E29.05; 438/139; 438/140

(58) Field of Classification Search
None
See application file for complete search history.

(56) References Cited

U.S. PATENT DOCUMENTS

| | | | | |
|---|---|---|---|---|
| 5,017,976 A | * | 5/1991 | Sugita ........................... | 257/494 |
| 2003/0020133 A1 | * | 1/2003 | Dahlqvist et al. ............. | 257/471 |
| 2006/0065899 A1 | * | 3/2006 | Hatakeyama et al. .......... | 257/77 |

(Continued)

FOREIGN PATENT DOCUMENTS

| | | |
|---|---|---|
| JP | 58-60577 A | 4/1983 |
| JP | 3-105975 A | 5/1991 |

(Continued)

OTHER PUBLICATIONS

U.S. Appl. No. 13/036,940, filed Feb. 28, 2011, Makoto Mizukami, et al.

(Continued)

*Primary Examiner* — Yasser A Abdelaziez
(74) *Attorney, Agent, or Firm* — Oblon, Spivak, McClelland, Maier & Neustadt, L.L.P.

(57) ABSTRACT

A semiconductor rectifier device includes a semiconductor substrate of a first conductive type of a wide gap semiconductor; a semiconductor layer of the first conductive type of the wide gap semiconductor formed on an upper surface of the semiconductor substrate, wherein an impurity concentration of the semiconductor layer is between 1E+14 atoms/cm$^3$ and 5E+16 atoms/cm$^3$ inclusive, and a thickness thereof is 8 μm or more; a first semiconductor region of the first conductive type of the wide gap semiconductor formed at the semiconductor layer surface; a plurality of second semiconductor regions of a second conductive type of the wide gap semiconductor formed as sandwiched by the first semiconductor regions, wherein a width of each of the second semiconductor regions is 15 μm or more; a first electrode formed on the first and second semiconductor regions; and a second electrode formed on a lower surface of the semiconductor substrate.

20 Claims, 23 Drawing Sheets

(56) References Cited

U.S. PATENT DOCUMENTS

| | | |
|---|---|---|
| 2007/0278609 A1 | 12/2007 | Harris et al. |
| 2009/0008651 A1* | 1/2009 | Okuno et al. .................. 257/77 |
| 2011/0175106 A1 | 7/2011 | Mizukami et al. |

FOREIGN PATENT DOCUMENTS

| | | |
|---|---|---|
| JP | 3-250670 A | 11/1991 |
| JP | 2008-541459 A | 11/2008 |
| JP | 2009-535849 A | 10/2009 |
| JP | 2010-3841 A | 1/2010 |
| JP | 2010-67937 A | 3/2010 |
| JP | 2010-87483 A | 4/2010 |

OTHER PUBLICATIONS

U.S. Appl. No. 13/215,410, filed Aug. 23, 2011, Kamaga, et al.

Japanese Office Action Issued Mar. 5, 2013 in Patent Application No. 2011-045935 (with English translation).

* cited by examiner

SEMICONDUCTOR RECTIFIER DEVICE

CROSS-REFERENCE TO RELATED APPLICATION

This application is based upon and claims the benefit of priority from Japanese Patent Application No. 2011-045935, filed on Mar. 3, 2011, the entire contents of which are incorporated herein by reference.

FIELD

Embodiments described herein relate generally to a semiconductor rectifier device.

BACKGROUND

Semiconductor rectifier devices for rectifying and outputting input current include a PiN diode having a pn junction and a Schottky barrier diode (SBD) having a carrier potential barrier caused by difference between work functions of metal and a semiconductor layer. In addition, in the Schottky barrier diode, there is also a JBS (Junction Barrier Schottky barrier diode) in which an impurity region (for example, p-type) having a conductivity type different from the semiconductor layer is arranged on the semiconductor layer surface for the purpose of alleviating an electric field applied onto the interface between the metal and the semiconductor layer (for example, n-type). Further, there is also an MPS (Merged PiN-diode Schottky-diode) in which the contact between the metal and the impurity region (for example, p-type) of the JBS is made to be ohmic connection or almost ohmic connection, and when a voltage more than a built-in potential (Vbi) between the impurity region and the semiconductor layer is applied, minority carriers are injected, so that this provides a function of reducing the resistance by conductivity modulation.

On the other hand, a wide band gap semiconductor such as a silicon carbide (which will be hereinafter referred to as SiC) is expected as a next-generation power semiconductor device material. The wide band gap semiconductor has a wider band gap than Si, and has a higher break-down electric field intensity and a higher thermal conductivity rate than Si. When this property is utilized, a low-loss power semiconductor device capable of operating at a high temperature can be realized.

In the MPS, a voltage causing the conductivity modulation is reduced, whereby the forward property has a lower resistance, and when a forward surge current flows in, a large current can be discharged with a low forward voltage. When a larger current than that of a normal state flows, the current causes junction break-down of an electrode and the like and crystal break-down caused by the heat generated according to the formula, current×voltage=energy. However, when a large current can be passed with a low forward voltage, exothermic energy can be suppressed, and this reduces break-down rate of the device.

DETAILED DESCRIPTION

Figure 1:
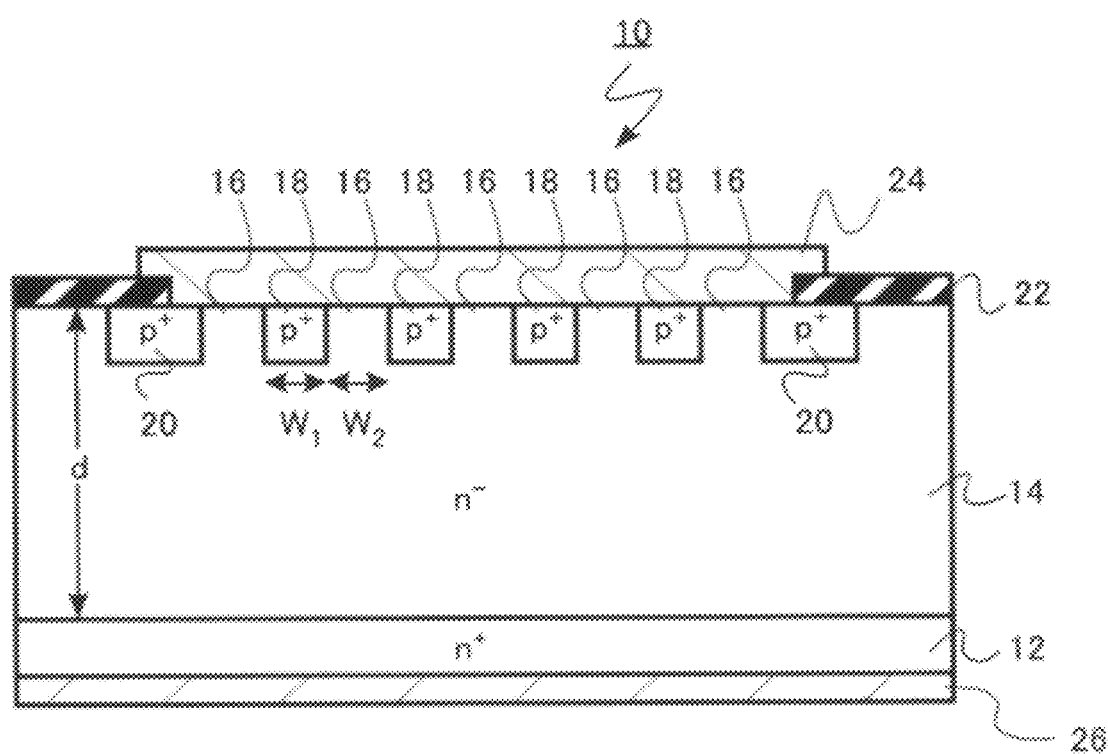
FIG. 1 is a cross sectional view illustrating a semiconductor rectifier device according to the first embodiment.

A semiconductor rectifier device according to an embodiment includes a semiconductor substrate of a first conductive type of a wide gap semiconductor, a semiconductor layer of the first conductive type of the wide gap semiconductor formed on an upper surface of the semiconductor substrate, wherein an impurity concentration of the semiconductor layer is between 1E+14 atoms/cm$^3$ and 5E+16 atoms/cm$^3$ inclusive, and a thickness thereof is 8 μm or more, a first semiconductor region of the first conductive type of the wide gap semiconductor formed at the semiconductor layer surface, a second semiconductor region of the second conductive type of the wide gap semiconductor formed as sandwiched by the first semiconductor regions, wherein a width of the second semiconductor region is 15 μm or more, a first electrode formed on the first and second semiconductor regions, and a second electrode formed on a lower surface of the semiconductor substrate.

The inventors have discovered that even if a conventional structure is used in an MPS using a wide band gap semiconductor whose required withstand voltage is 1200 V (hereinafter also referred to as 1200 V class) or more, minority carriers are injected and accordingly, a voltage at which a conductivity modulation occurs (hereinafter referred to as hole injection voltage when minority carriers are hole) cannot be sufficiently reduced.

For example, in a conventional MPS using Si, Vbi of Si is 0.8 to 1.0 V, and the voltage at which the conductivity modulation occurs is 1 to 1.5 V. In an MPS of SiC, Vbi of SiC is 2.5 to 3.0 V, and the voltage at which the conductivity modulation occurs is 3.2 V in a device of 600 V class withstand voltage. In this manner, when a voltage of +1 V or less is applied as Vbi, minority carriers are injected (MPS of SiC: p+ type impurity region width is 2 μm, n-type Schottky region width is 0.8 μm, and the temperature is 125° C.).

In the MPS, the p+ type impurity region becomes dead space when an electron current (majority carrier) is passed. Therefore, in general, the p+ type impurity region width is reduced. Then, for example, a hole injection voltage of an MPS will be calculated where the p+ type impurity region width is 1 μm, the n-type impurity region width (n-type Schottky region width) is 1 μm, and the temperature is 125° C. In 600 V class, the hole injection voltage is 4.4 V. In 1200 V class, the hole injection voltage is 6.9 V. In 3300 V class, the hole injection voltage is 10.85 V. In 4500 V class, the hole injection voltage is 13.53 V. Therefore, in a device whose withstand voltage is middle, i.e., 1200 V class or more, and a device whose withstand voltage is high, i.e., 3300 V class or more, the hole injection voltage becomes extremely high, and the resistance cannot be reduced by the conductivity modulation.

An object to be solved by the present invention is to provide a semiconductor rectifier device using a wide band gap semiconductor for reducing a voltage at which minority carriers are injected and having sufficient surge current resistance.

Hereinafter, embodiments of the present invention will be explained with reference to drawings.

In this specification, the width of a semiconductor region means the shortest distance from a point at an end portion of a figure defining the semiconductor region to the end portion thereof with the semiconductor region disposed therebetween. For example, when the width of the semiconductor region is 15 μm or more, this means that the width is 15 μm or more in 50% or more of the end portion of the figure defining the semiconductor region.

First Embodiment

A semiconductor rectifier device according to the present embodiment includes a semiconductor substrate of a first conductive type of a wide gap semiconductor, a semiconductor layer of the first conductive type of the wide gap semiconductor formed on an upper surface of the semiconductor substrate, wherein an impurity concentration of the semiconductor layer is between 1E+14 atoms/cm$^3$ and 5E+16 atoms/cm$^3$ inclusive, and a thickness thereof is 8 μm or more, a first semiconductor region of the first conductive type of the wide gap semiconductor formed at the semiconductor layer surface, a second semiconductor region of the second conductive type of the wide gap semiconductor formed as sandwiched by the first semiconductor regions, wherein a width of the second semiconductor region is 15 μm or more, a first electrode formed on the first and second semiconductor regions, and a second electrode formed on a lower surface of the semiconductor substrate.

Since the semiconductor rectifier device according to the present embodiment has the above configuration, a hole injection voltage can be sufficiently reduced, and the resistance against the forward surge current can be improved. Alternatively, ON-current can be increased.

Hereinafter, for example, an MPS will be explained in which a wide band gap semiconductor is silicon carbide (which may be hereinafter referred to as SiC), the first conductive type is n-type, and the second conductive type is p-type.

Figure 2:
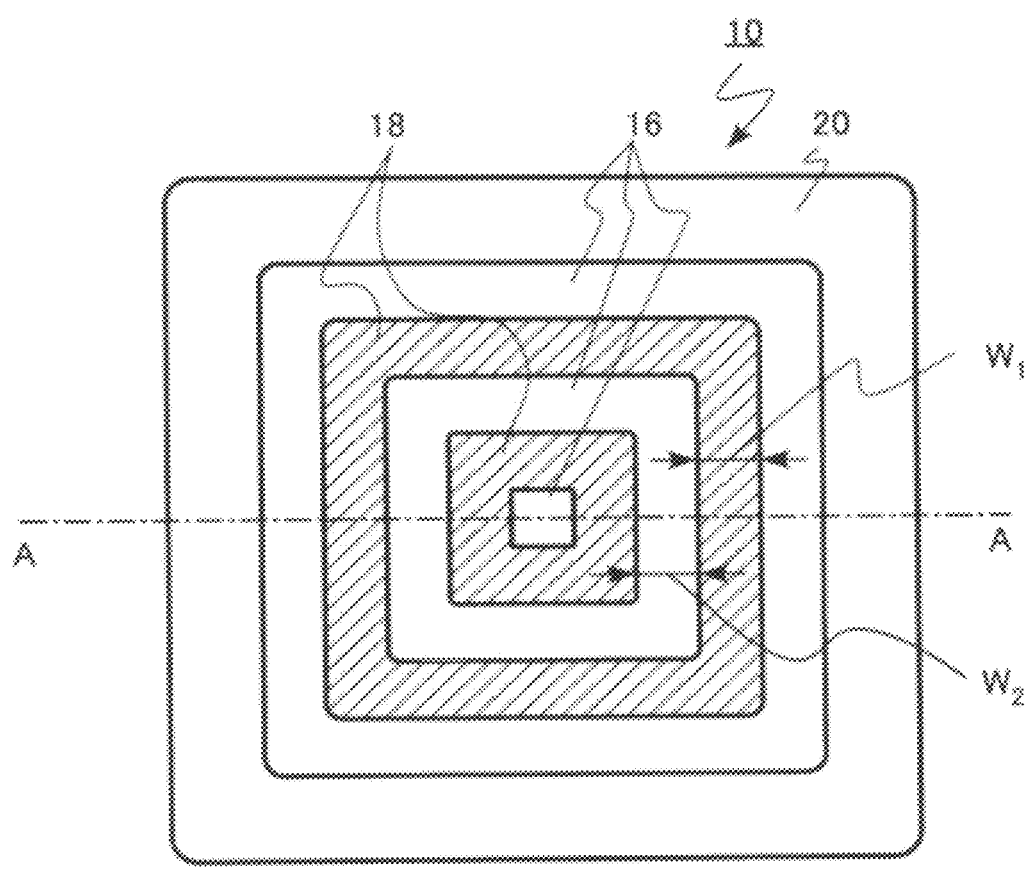
FIG. 2 is a top view illustrating the semiconductor rectifier device according to the first embodiment.

FIGS. 1 and 2 are a cross sectional view and a top view, respectively, schematically illustrating an MPS, i.e., a semiconductor rectifier device according to the present embodiment. FIG. 1 is a cross sectional view taken along A-A of FIG. 2.

As shown in FIG. 1, an MPS 10 according to the present embodiment includes, for example, an n-type SiC layer 14 serving as a drift layer (semiconductor layer) is formed on an upper surface of an n+ type 4H—SiC substrate (semiconductor substrate) 12. The 4H—SiC substrate 12 and the n-type SiC layer 14 include, for example, N (nitrogen) as impurity.

The n+ type 4H—SiC substrate 12 is a low resistance substrate, in which the impurity concentration is, for example, 5E+18 to 1E+19 atoms/cm$^3$. The impurity concentration of the n-type SiC layer 14 is between 1E+14 atoms/cm$^3$ and 5E+16 atoms/cm$^3$ inclusive, and the thickness thereof (denoted with "d" in FIG. 1) is 8 μm or more.

The MPS 10 is an MPS whose required withstand voltage is 1200 V to 7000 V, which is a so-called middle to high withstand voltage MPS of 1200 V class to 7000 V class. As described above, in order to achieve a high withstand voltage and sufficient ON-current density, the above impurity concentration and thickness are necessary conditions of the n-type SiC layer 14.

At the surface of the n-type SiC layer 14, there is an n-type impurity region (n-type Schottky region: first semiconductor region) 16. The n-type impurity regions 16 correspond to an upper portion of the n-type SiC layer 14.

Each of p+ type impurity regions (second semiconductor regions) 18 is formed so as to be sandwiched between the n-type impurity regions 16, and the p+ type impurity region 18 includes, for example, about 1E+18 atoms/cm$^3$ of Al (aluminum) or B (boron) as impurity. The depth of the p+ type impurity region 18 is, for example, about 0.3 to 1.0 μm. The width of the p+ type impurity region 18 (denoted with "$W_1$" in the figure) is 15 µm or more. The concentration of the p+ type impurity region 18 is desirably as high as possible in order to cause the characteristic of the junction with the first electrode to be ohmic or almost ohmic.

When the width of the P+ type impurity region 18 (denoted with "$W_1$" in the figure) is less than 15 µm, the hole injection voltage cannot be sufficiently reduced, and the resistance against the forward surge current cannot be improved.

At the outside of the p+ type impurity region 18, a RESURF region 20 is formed. The RESURF region 20 is wider than the p+ type impurity region 18, and has, for example, about the same impurity concentration and depth as the p+ type impurity region 18. The RESURF region is arranged to stabilize the withstand voltage of the MPS.

The surface of the n-type SiC layer 14 is covered with an insulating film 22 made of, for example, silicon oxide film. A first electrode (anode electrode) 24 made of, for example, Ni is formed in an opening portion of the insulating film 22, so that the first electrode is joined with the n-type impurity regions 16 and the p+ type impurity regions 18. The first electrode (anode electrode) 24 is formed to be in contact with a portion of the RESURF region 20. Further, a second electrode (cathode electrode) 26 made of, for example, Ni is formed on a lower surface of the n+ type 4H—SiC substrate 12.

In the horizontal plane, as shown in FIG. 2, an n-type impurity region 16 is provided in the innermost peripheral portion, and a P+ type impurity region 18 having a width $W_1$ and an N-type impurity region 16 having a width $W_2$ are alternately formed toward the outer peripheral side. In this case, the center is the same, and each of them has substantially the same width $W_1$, and two p+ type impurity regions 18 basically in the squares are formed.

Further, the RESURF region 20 is formed outside of the n-type impurity region 16 of the outermost periphery so as to enclose the n-type impurity region 16 of the outermost periphery. The n-type impurity regions 16 and the p+ type impurity regions 18 enclosed by the RESURF region 20 make an active region of the MPS.

Subsequently, a manufacturing method for the semiconductor rectifier device according to the present embodiment as shown in FIGS. 1 and 2 will be explained. First, on the upper surface of the n+ type 4H—SiC substrate 12, an n-type SiC layer 14 having a thickness (denoted with "d" in FIG. 1) of 8 µm or more is formed with epitaxial growth.

Subsequently, on the surface of the n-type SiC layer 14, a mask material is patterned by lithography method. Al or B is ion-injected using the resist as a mask. Thereafter, the mask material is removed, and the substrate is washed. Then, activation annealing process is performed at 1500° C. to 2000° C. In this manner, the p+ type impurity regions 18 and the RESURF region 20 are formed.

Thereafter, for example, the insulating film 22 made of the silicon oxide film is formed, and the insulating film 22 is patterned using lithography and RIE methods, so as to expose the n-type impurity regions 16, the p+ type impurity regions 18, and a portion of the SURF region 20. Then, for example, Ni is deposited by sputtering method, and thereafter, the first electrode (anode electrode) 24 is formed with patterning process. For example, Ni is deposited by the sputtering method on the lower surface of the 4H—SiC substrate 12, and the second electrode (cathode electrode) 26 is formed with patterning process.

The MPS 10 as shown in FIGS. 1 and 2 can be manufactured by the above manufacturing method.

Figure 3:
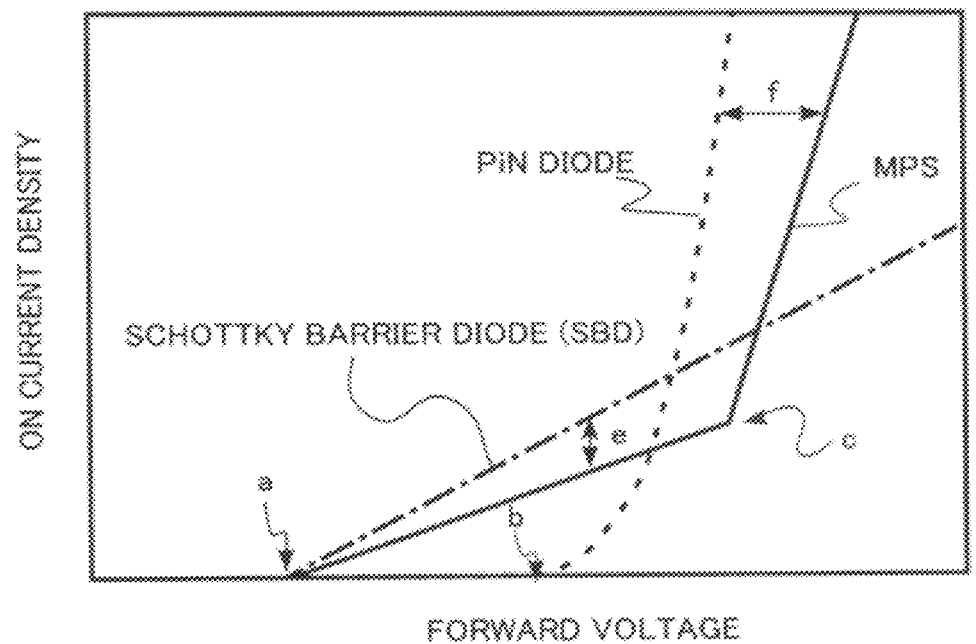
FIG. 3 is an explanatory diagram illustrating relationships between ON-current densities and forward voltages of various kinds of semiconductor rectifier device s.

FIG. 3 is an explanatory diagram illustrating relationships between ON-current densities and forward voltages of various kinds of semiconductor rectifier devices. An ON-current density of an SBD indicated by an alternate long and short dashed line rises at a voltage indicated by arrow a. This rising voltage is determined by a Schottky barrier height ($\phi B$) of Schottky junction between the anode electrode and the n-type impurity region.

On the other hand, an ON-current density of a PiN diode indicated by a dotted line rises at a voltage indicated by arrow b. This rising voltage is determined by a built-in potential (Vbi) of the pn junction.

When the MPS has both the Schottky junction and the pn junction, the ON-current density indicated by a solid line rises at the voltage indicated by arrow a, and when the voltage reaches a voltage at which hole injection occurs indicated by arrow c, i.e., a hole injection voltage, the conductivity modulation occurs and the ON-current density rapidly increases. By decreasing the hole injection voltage, the exothermic energy can be suppressed, and the break-down rate of the device can be reduced when a forward surge current occurs.

The difference between the ON-current density of the MPS and the ON-current density of the SBD indicated by double-headed arrow e increases as the ratio of the size of the p+ type impurity region arranged in the MPS increases. The difference between the ON-current density of the MPS and the ON-current density of the PiN diode indicated by double-headed arrow f decreases as the ratio of the size of the p+ type impurity region increases.

Figure 4:
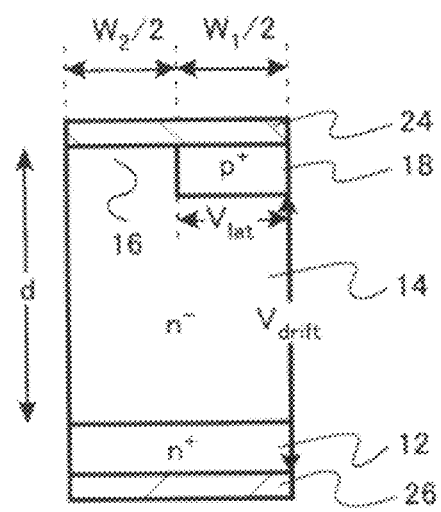
FIG. 4 is a structural cross sectional view illustrating a semiconductor rectifier device used for simulation.

FIG. 4 is a structural cross sectional view illustrating a semiconductor rectifier device used for current-voltage characteristic simulation. A size equivalent to the half pitch of a repetition of the n-type impurity region 16 and the p+ type impurity region 18 in the active region of the MPS is adopted as a unit structure.

Half of the width of the p+ type impurity region 18 is $W_1/2$, and the half of the width of the n-type impurity region 16 is $W_2/2$. The thickness of the n-type SiC layer 14, i.e., the drift layer, is d. Then, voltage is applied between the first electrode (anode electrode) 24 and the second electrode (cathode electrode) 26, and a potential distribution immediately before minority carriers are injected from the p+ type impurity regions 18 to the n-type SiC layer 14 is obtained according to simulation.

The voltage drop from the lower surface of the SiC substrate 12 to the bottom surface of the p+ type impurity region 18 (denoted with double-headed arrow in the figure) obtained from the simulation result is denoted with $V_{drift}$. The voltage drop from an end portion of the p+ type impurity region 18 to a central portion of the bottom surface of the p+ type impurity region 18 in width direction (denoted with double-headed arrow in the figure) is denoted with $V_{lat}$.

Figure 5:
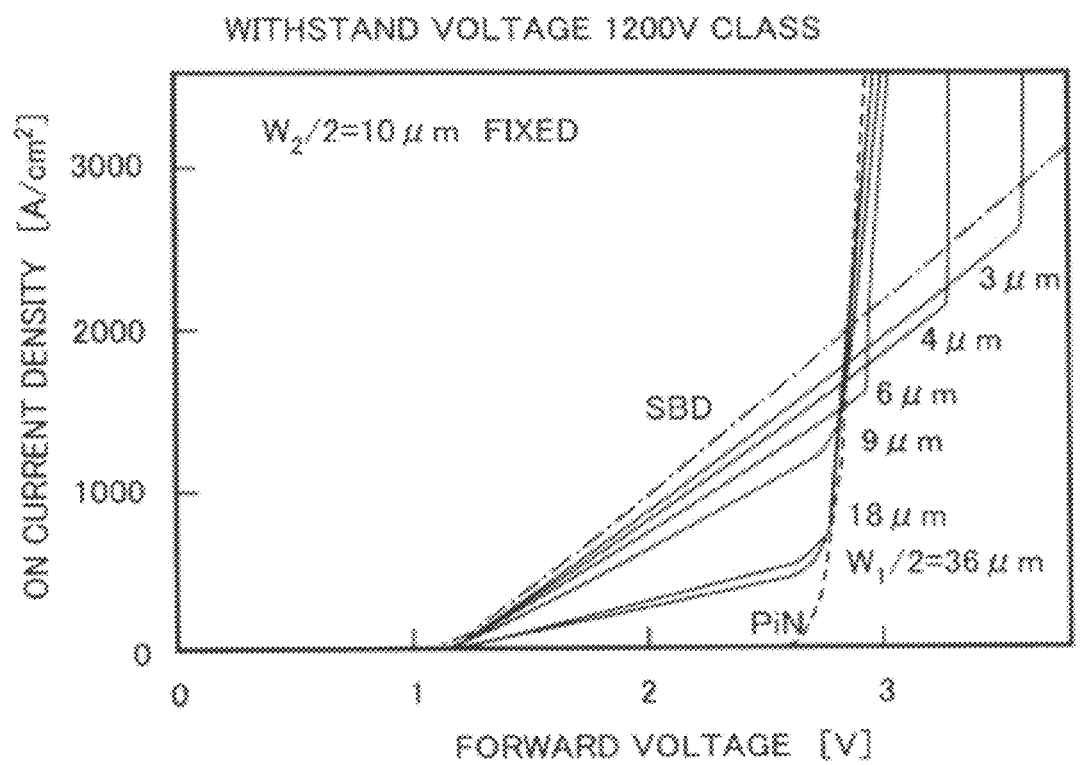
FIG. 5 is a figure illustrating a simulation result of p+ type impurity region width dependency of the ON-current density in the semiconductor rectifier device according to the first embodiment.

FIG. 5 is a figure illustrating a simulation result of p+ type impurity region width dependency of the ON-current density in the semiconductor rectifier device according to the present embodiment. This shows a simulation result of relationship between ON-current densities and forward voltages in an MPS whose withstand voltage is 1200 V class. As comparisons, this also shows characteristics of a SBD and a PiN diode whose withstand voltage is 1200 V class. The measurement temperature is 150° C.

The thickness d of the n-type SiC layer 14 of the MPS is 8 µm, and the impurity concentration is 6E+15 atoms/cm$^3$. The thickness of the SiC substrate 12 is 1.0 µm, and the depth of the p+ type impurity region 18 is 0.6 µm. The half of the width of the n-type impurity region 16, i.e., $W_2/2$, is fixed to 10 µm.

The hole injection voltage at which the ON-current density of the MPS rapidly rises relies on the half of the width of the p+ type impurity region 18, i.e., $W_1/2$, and when $W_1/2$ is equal to 9 μm, the voltage is about the same as the voltage of the PiN diode.

Figure 6:
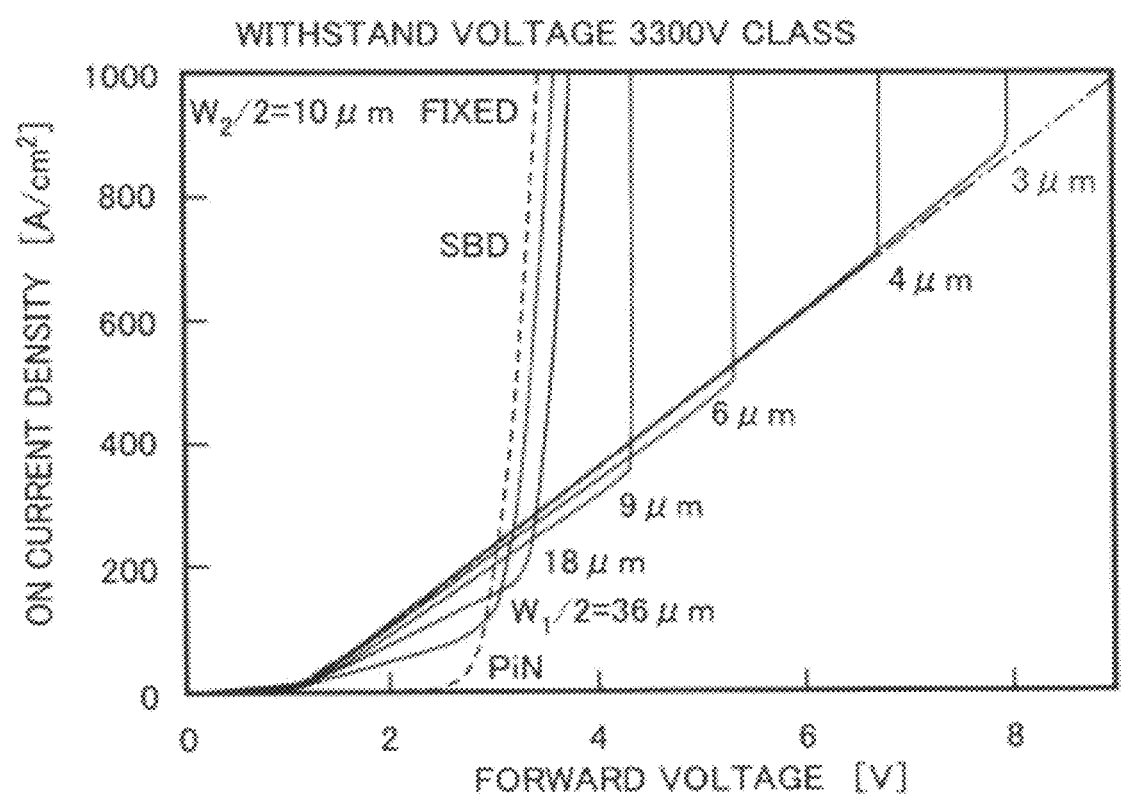
FIG. 6 is a figure illustrating a simulation result of p+ type impurity region width dependency of the ON-current density in the semiconductor rectifier device according to the first embodiment.

FIG. 6 is a figure illustrating a simulation result of p+ type impurity region width dependency of the ON-current density in the semiconductor rectifier device according to the present embodiment. This shows a simulation result of relationship between ON-current densities and forward voltages in an MPS whose withstand voltage is 3300 V class. As comparisons, characteristics of a SBD and a PiN diode whose withstand voltage is 3300 V class are also shown. The measurement temperature is 150° C.

The thickness d of the n-type SiC layer 14 of the MPS is 25 μm, and the impurity concentration is 4E+15 atoms/cm$^3$. The thickness of the SiC substrate 12 is 1.0 μm, and the depth of the p+ type impurity region 18 is 0.6 μm. The half of the width of the n-type impurity region 16, i.e., $W_2/2$, is fixed to 10 μm.

The hole injection voltage at which the ON-current density of the MPS rapidly rises relies on the half of the width of the p+ type impurity region 18, i.e., $W_1/2$, and when $W_1/2$ is equal to 36 μm, the voltage is about the same as the voltage of the PiN diode.

Figure 7:
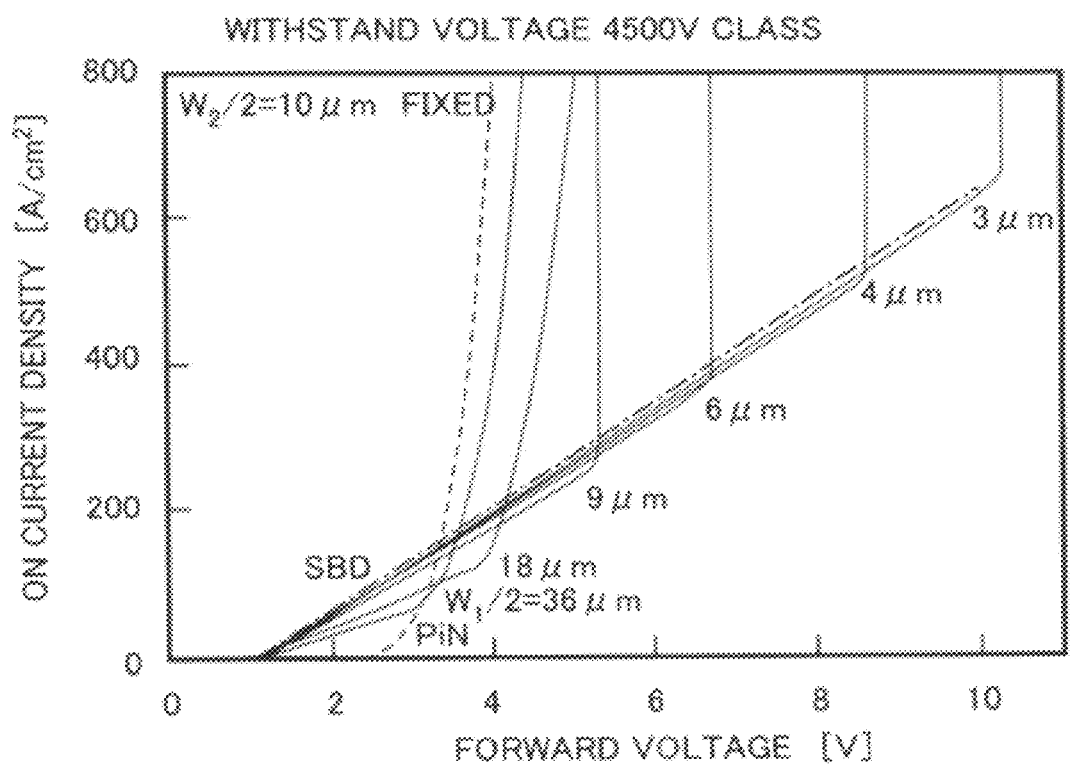
FIG. 7 is a figure illustrating a simulation result of p+ type impurity region width dependency of the ON-current density in the semiconductor rectifier device according to the first embodiment.

FIG. 7 is a figure illustrating a simulation result of p+ type impurity region width dependency of the ON-current density in the semiconductor rectifier device according to the present embodiment. This shows a simulation result of relationship between ON-current densities and forward voltages in an MPS whose withstand voltage is 4500 V class. As comparisons, characteristics of a SBD and a PiN diode whose withstand voltage is 3300 V class are also shown. The measurement temperature is 150° C.

The thickness d of the n-type SiC layer 14 of the MPS is 35 μm, and the impurity concentration is 3E+15 atoms/cm$^3$. The thickness of the SiC substrate 12 is 1.0 μm, and the depth of the p+ type impurity region 18 is 0.6 μm. The half of the width of the n-type impurity region 16, i.e., $W_2/2$, is fixed to 10 μm.

The hole injection voltage at which the ON-current density of the MPS rapidly rises relies on the half of the width of the p+ type impurity region 18, i.e., $W_1/2$, and when $W_1/2$ is equal to 36 μm, the voltage is about the same as the voltage of the PiN diode.

As described above, the above simulation indicates that, in the MPS whose withstand voltage is middle, i.e., 1200 V class, the hole injection voltage cannot attain a value as much as the value of the PiN diode unless the half of the width of the p+ type impurity region is expanded to about 9 μm (total width 18 μm). On the other hand, in the MPS whose withstand voltage is high, i.e., 3300 V class or more, the hole injection voltage cannot attain a value as much as the value of the PiN diode unless the half of the width of the p+ type impurity region is expanded to about 36 μm (total width 72 μm).

Figure 8:
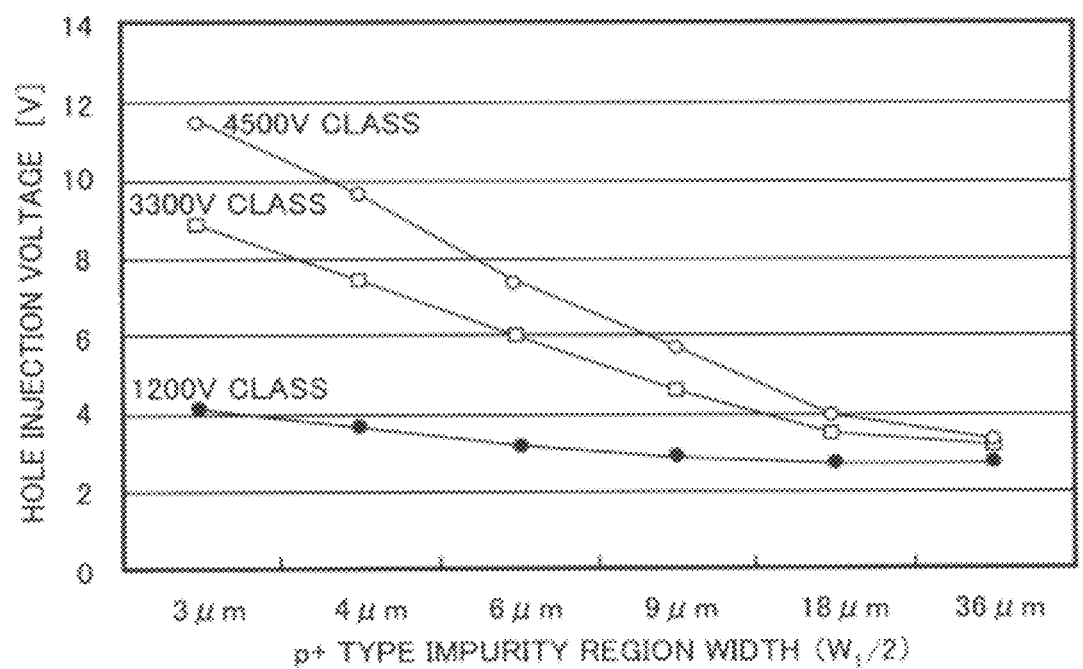
FIG. 8 is a figure illustrating relationship between a hole injection voltage and a p+ type impurity region width in the semiconductor rectifier device according to the first embodiment.

FIG. 8 is a figure illustrating relationship between a hole injection voltage and a p+ type impurity region width in the semiconductor rectifier device according to the present embodiment. FIG. 8 is a figure summarizing FIGS. 5 to 7.

When the MPS whose withstand voltage is high, i.e., 3300 V class and 4500 V class, is compared with the MPS whose withstand voltage is middle, i.e., 1200 V class, the p+ type impurity region width dependency of the hole injection voltage is high in the MPS whose withstand voltage is high, i.e., 3300 V class and 4500 V class. On the other hand, in the MPS whose withstand voltage is middle, the above dependency is saturated when the half of the width of the p+ type impurity region is about 9 μm (total width 18 μm). In the MPS whose withstand voltage is high, the above dependency is saturated when the half of the width of the p+ type impurity region is about 18 μm (total width 36 μm). Therefore, the present embodiment is effective for MPS whose withstand voltage is higher. In other words, the present embodiment is more effective for 3000 V class having d=20 μm than 1200 V class having d=8 μm, more effective for 3300 V class having d=25 μm than 3000 V class, more effective for 4500 V class having d=35 μm than 3300 V class.

Figure 9A:
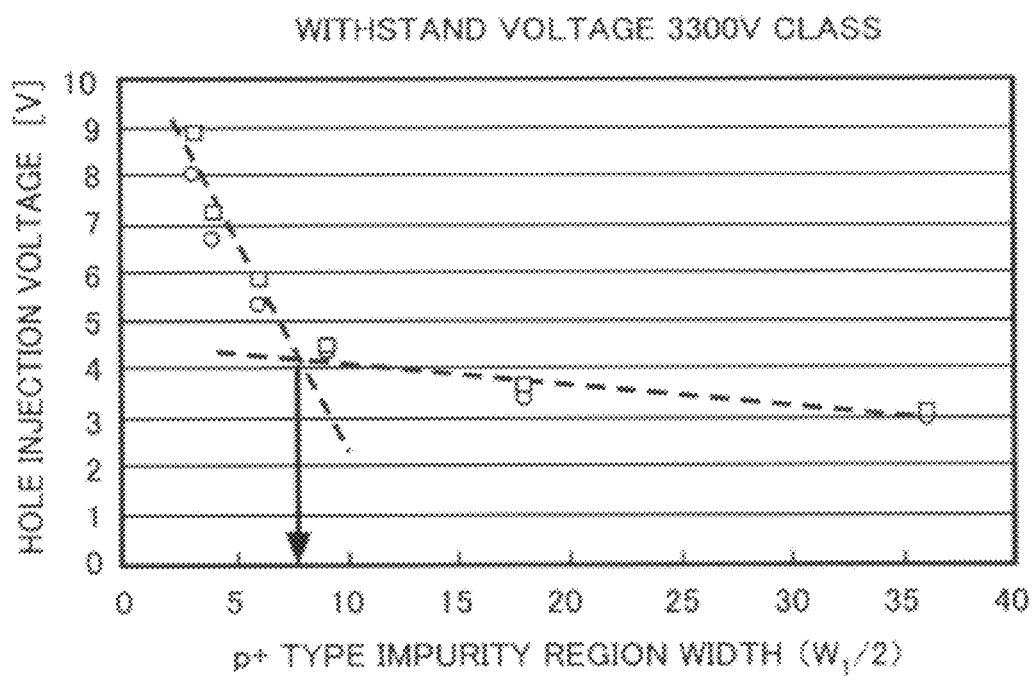
FIGS. 9A and 9B are figures each illustrating relationship between a hole injection voltage and a p+ type impurity region width in the semiconductor rectifier device according to the first embodiment.
Figure 9B:
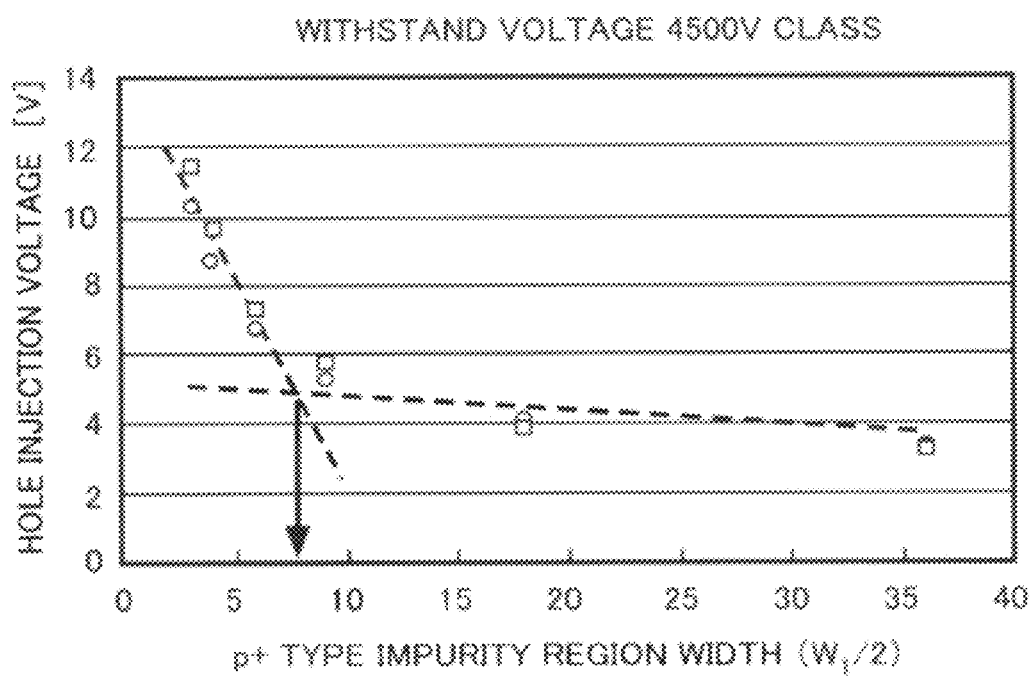

FIGS. 9A and 9B are figures each illustrating relationship between a hole injection voltage and a p+ type impurity region width in the semiconductor rectifier device according to the present embodiment. FIG. 9A shows a case of MPS of 3300 V class. FIG. 9B shows a case of MPS of 4500 V class.

FIGS. 9A and 9B include results at a measurement temperature of 25° C. in addition to the results of FIGS. 5 to 7. White rectangles represent a result at 25° C., and white circles represent a result at 150° C. In the horizontal axis, a line plotted and fitted with linear scale is represented by a dotted line.

As is evident from the figure, in any of 3300 V class and 4500 V class, the p+ type impurity region width dependency of the hole injection voltage does not rely on the temperature and is alleviated when the width of the half of the p+ type impurity region is about 7.5 μm (total width 15 μm). In a region where the width of the half of the p+ type impurity region is 18 μm (total width 36 μm) or more, the dependency is almost saturated. This tendency is the same in the MPS whose withstand voltage is middle, i.e., 1200 V class, having d=8 μm.

Therefore, in the MPS whose withstand voltage is middle/high, i.e., 1200 V class or more, having d=8 μm or more, the total width of the p+ type impurity region width is required to be 15 μm or more so as to reduce the break-down rate of the device when a forward surge current occurs and to reduce variation of the break-down rates of the devices. In the MPS whose withstand voltage is middle having d=about 8 μm, it is desirably 18 μm or more. In the MPS whose withstand voltage is high, i.e., 3300 V class, having d=25 μm or more, it is desirably 36 μm or more.

Figure 10:
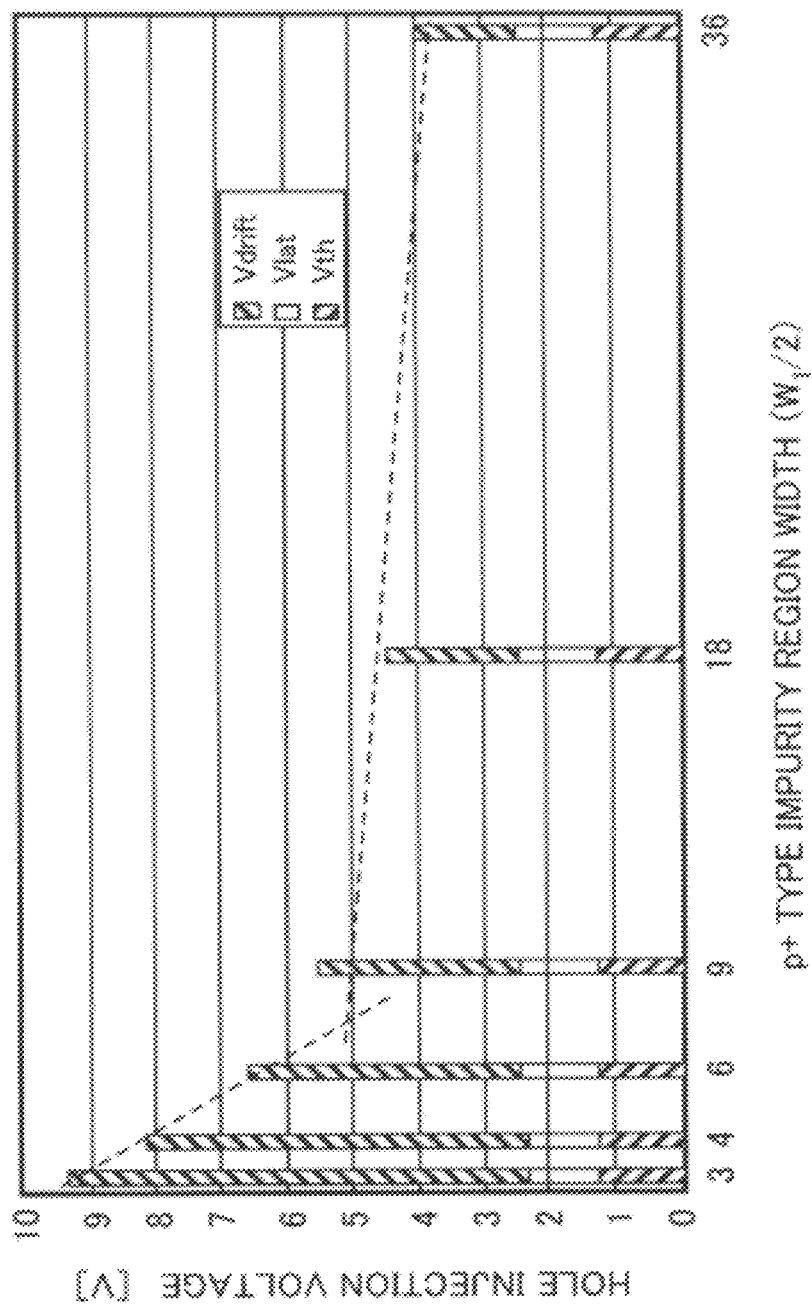
FIG. 10 is a figure illustrating relationship between each component of the p+ type impurity region width and the hole injection voltage in the semiconductor rectifier device according to the first embodiment.

FIG. 10 is a figure illustrating relationship between the p+ type impurity region width and the hole injection voltage and each component thereof in the semiconductor rectifier device according to the present embodiment. The hole injection voltage is shown as it is decomposed into components, i.e., a rising voltage $V_{th}$ of Schottky diode, a voltage drop $V_{lat}$ from the end portion of the p+ type impurity region to the central portion of the bottom surface of the p+ type impurity region in width direction, a voltage drop $V_{drift}$ from the lower surface of the SiC substrate to the bottom surface of the p+ type impurity region. It should be noted that each component is obtained from a potential distribution immediately before hole injection. More specifically, it is obtained from a potential distribution when the hole injection concentration becomes 1E14 atoms/cm$^3$ in the central portion of the bottom surface of the p+ type impurity region in width direction.

The main reason why the hole injection voltage becomes high in the MPS whose withstand voltage is high, i.e., 1200 V class or more and in particular 3300 V class or more, is considered to be a large voltage drop caused by the drift layer whose film thickness is thick and whose concentration is low. As described above, the + type impurity region width dependency of the hole injection voltage is alleviated when the width of the half of the p+ type impurity region is about 7.5 μm (total width 15 μm). At this occasion, the relationship of $V_{lat}=0.3\times V_{drift}$ holds.

As described above, in the region where the width of the half of the p+ type impurity region is 18 μm (total width 36

μm) or more, the dependency is almost saturated. At this occasion, the relationship of $V_{lat}=0.89\times V_{drift}$ holds.

Therefore, in the MPS whose withstand voltage is high, i.e., 3300 V class or more, the relationship of $V_{lat}\geq 0.3\times V_{drift}$ needs to be satisfied, and more preferably, the relationship of $V_{lat}\geq 0.89\times V_{drift}$ is satisfied so as to reduce the break-down rate of the device when a forward surge current occurs and to reduce variation of the break-down rates of the devices.

Whether the above relationship is satisfied or not can be determined by executing the above simulation of the potential distribution when the structure of the semiconductor rectifier device is determined.

Figure 11:
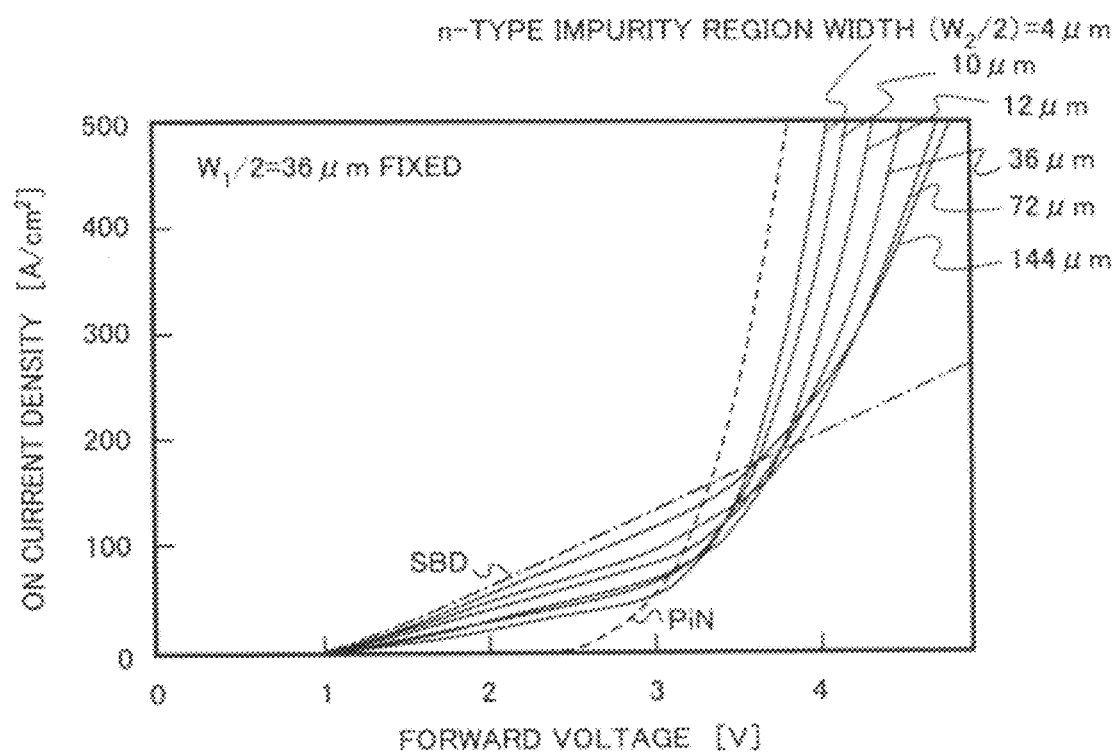
FIG. 11 is a figure illustrating a simulation result of the n-type impurity region width dependency of the ON-current density in the semiconductor rectifier device according to the first embodiment.

FIG. 11 is a figure illustrating a simulation result of the N-type impurity region width dependency of the ON-current density in the semiconductor rectifier device according to the present embodiment. FIG. 11 shows a simulation result of 3300 class MPS at 150° C. The width of the half of the p+ type impurity region, $W_1/2$, is fixed to 36 μm.

At around 2 to 3 V, i.e., a voltage at which the MPS is actually used, the ON-current density becomes close to that of the SBD when the n-type impurity region width increases, and when the width is 36 μm (total width 72 μm) which is about the same as the p+ type impurity region width, the ON-current density equal to or more than half of the SBD can be ensured, and when the width is 144 μm (total width 288 μm) or more, the ON-current density attains almost the same value. Therefore, in order to ensure the ON-current density, the n-type impurity region width is desirably 72 μm or more. More desirably, it is 288 μm.

In the present embodiment, when the semiconductor rectifier device operates as the MPS and effectively pass the surge current between the p+ type impurity region and the n-type impurity region, the first electrode 24 and n-type impurity region 16 are desirably Schottky-connected, and the first electrode 24 and the p+ type impurity region 18 are desirably ohmic-connected.

As described above, according to the semiconductor rectifier device of the present embodiment, a large current can be passed with a low forward voltage, and the exothermic energy is suppressed, so that the break-down rate of the device can be reduced. Therefore, a semiconductor rectifier device using a wide band gap semiconductor having sufficient surge current resistance or high ON-current can be provided.

Modification of the First Embodiment

Figure 12:
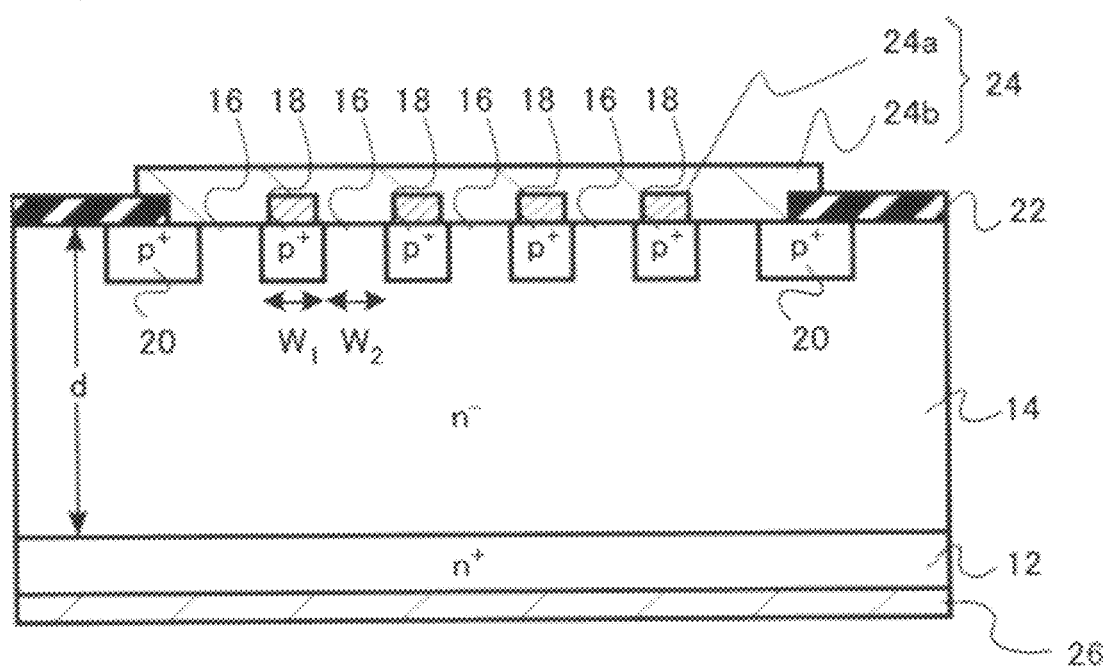
FIG. 12 is a cross sectional view illustrating a semiconductor rectifier device according to a modification of the first embodiment.

FIG. 12 is a schematic cross sectional view illustrating a semiconductor rectifier device according to a modification of the first embodiment. This MPS is the same as the first embodiment except that a first electrode 24 is constituted by an ohmic electrode 24a and a Schottky electrode 24b which are made of different materials. Accordingly, the same contents as those of the first embodiment are omitted.

The ohmic electrode 24a is in contact with at least a portion of a p+ type impurity region 18, and is in ohmic connection with the p+ type impurity region 18. For example, the ohmic electrode 24a is formed with Ti/Al. On the other hand, the Schottky electrode 24b is in contact with an n-type impurity region 16, and is in Schottky connection with the n-type impurity region 16. For example, the Schottky electrode 24b is formed with Ti/Al.

As described above, the first electrode 24 is constituted by the two electrodes. Therefore, the ohmic characteristic of the first electrode with respect to the p+ type impurity region 18 can be improved, and high withstand voltage semiconductor rectifier device with further improved characteristic can be provided.

In a step corresponding to the step of forming the first electrode 24d in the manufacturing method according to the first embodiment, the semiconductor rectifier device of FIG. 12 can be manufactured by depositing, for example, Ti/Al by sputtering method, performing patterning process to form the ohmic electrode 24a selectively remaining on the p+ type impurity region 18, thereafter depositing, for example, Ni by sputtering method, and performing patterning process to form the Schottky electrode 24b.

It should be noted that, in order to further improve the ohmic property of the ohmic electrode 24a, the surface concentration of the p+ type impurity region 18 is desirably high, i.e., 1E+19 to 1E+21 atoms/cm³. The concentration of the surface can be increased by locally ion-injecting P-type impurity to the surface of the P+ type impurity region 18.

Second Embodiment

The semiconductor rectifier device according to the present embodiment has not only the configuration of the semiconductor rectifier device according to the first embodiment but also a third wide band gap semiconductor region of the second conductive type having a narrower width than the second wide band gap semiconductor region and at least a portion of which is connected to the second wide band gap semiconductor region. The second embodiment is the same as the first embodiment except that the second embodiment has the third wide band gap semiconductor region. Accordingly, the same contents as those of the first embodiment are omitted.

Since the semiconductor rectifier device according to the present embodiment has the above configuration, region for passing currents can be enlarged and dispersed when a forward surge current occurs. Therefore, the resistance against the forward surge current can be further improved.

Figure 13:
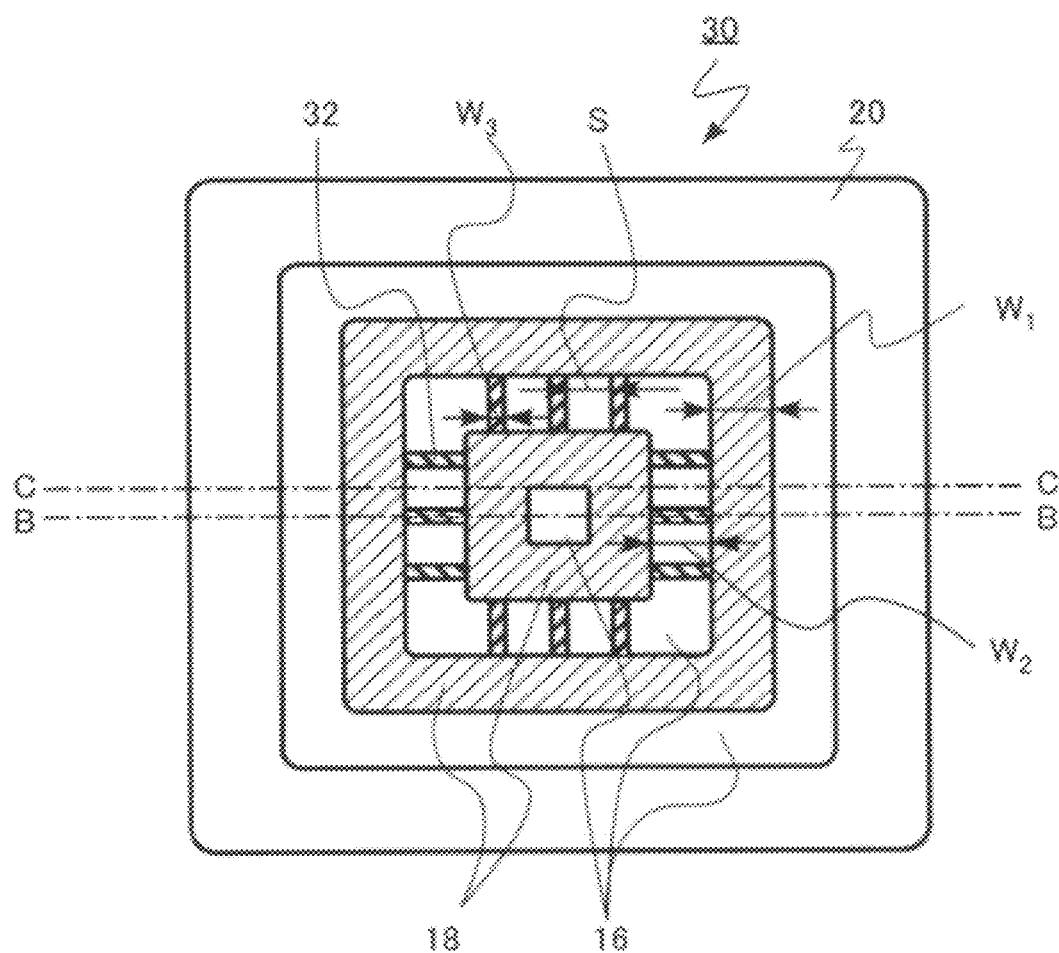
FIG. 13 is a top view illustrating a semiconductor rectifier device according to the second embodiment.
Figure 14A:
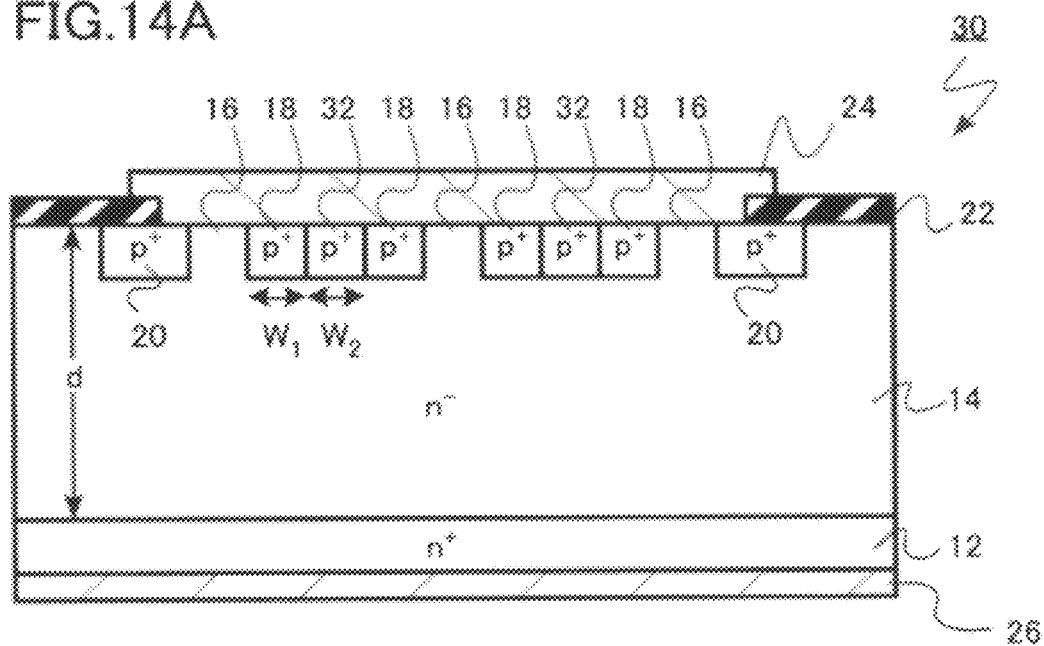
FIGS. 14A and 14B are cross sectional views each illustrating the semiconductor rectifier device according to the second embodiment.
Figure 14B:
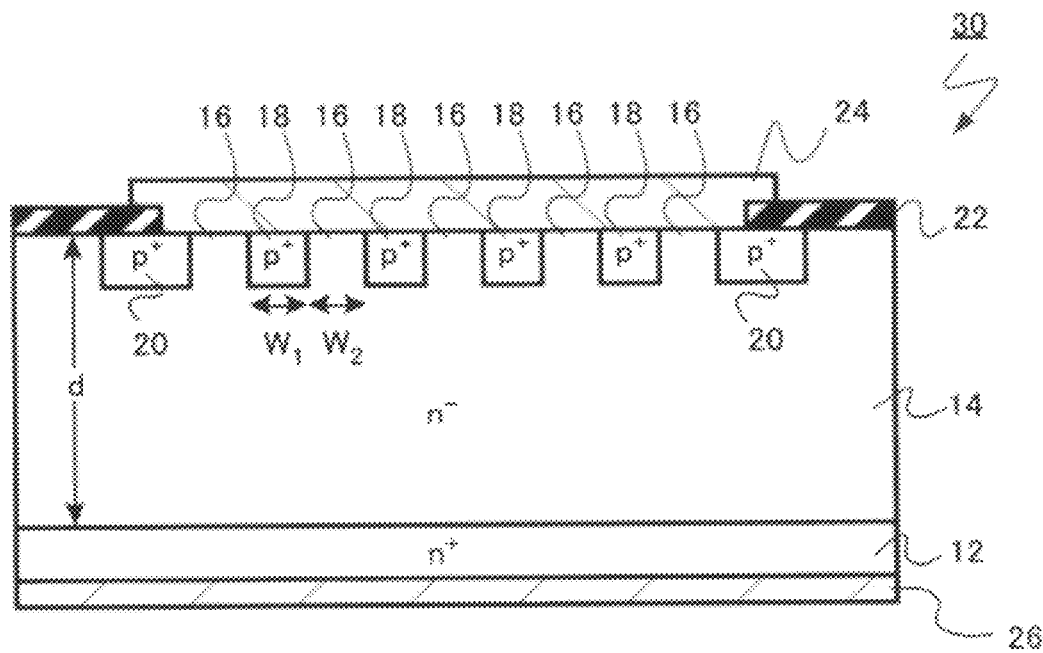

FIGS. 13, 14A, and 14B are a schematic top view and schematic cross sectional views, respectively, each illustrating an MPS serving as a semiconductor rectifier device according to the present embodiment. FIG. 14A is a cross sectional view taken along B-B of FIG. 12. FIG. 14B is a cross sectional view taken along C-C of FIG. 12.

As shown in the figures, an MPS 30 according to the present embodiment includes not only an MPS according to the first embodiment but also a propagation region 32 both ends of which are connected to p+ type impurity regions 18 and has a narrower width than the P+ type impurity region 18. The propagation region 32 is formed so as to be sandwiched by n-type impurity regions 16.

Like the p+ type impurity region 18, the propagation region 32 is formed using ion injection of Al or B. The impurity concentration of the propagation region 32 is, for example, about 1E+18 atoms/cm³, and the depth thereof is, for example, about 0.3 to 1.0 μm.

Figure 15:
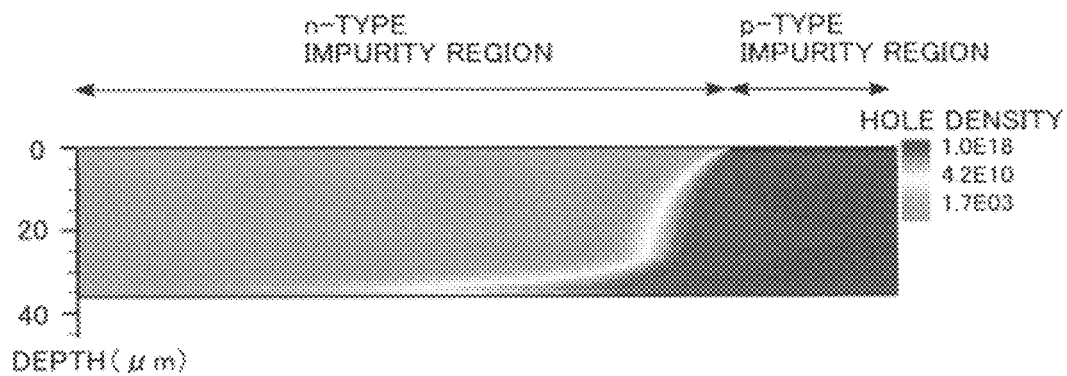
FIG. 15 is an explanatory diagram illustrating an effect of the semiconductor rectifier device according to the second embodiment.

FIG. 15 is an explanatory diagram illustrating an effect of a semiconductor rectifier device according to the present embodiment. The figure is a distribution map of hole injection concentration in the MPS according to the first embodiment, where the width of the half of the p+ type impurity region is set at 36 μm (total width 72 μm), and the width of the half of n-type impurity region is set at 144 μm (total width 288 μm).

As is evident from the figure, holes are selectively injected to a lower portion of the p+ type impurity region, but the holes do not reach the n-type impurity region. Therefore, it is understood that, when a forward surge current occurs, a region generating heat is unevenly located in a portion where the p+ type impurity region exists. This may be a cause of local electrode separation and crystal destruction, which may increase a percent defective.

According to the present embodiment, the propagation regions 32 are provided, so that the hole injection is dispersed over a wide range of the activated region of the device. Therefore, the heating region can be dispersed, and the percent defective caused by the forward surge current can be further reduced.

The decrease of the ON-current density caused by the propagation regions 32 can be suppressed by reducing the width of the propagation region 32 to a width less than the p+ type impurity region 18. It is confirmed that, even if the width of the propagation region 32 is less than, for example, 15 μm which is required in the p+ type impurity region 18, holes are propagated due to plasma spreading effect from the p+ type impurity region 18, so that the holes are injected even in the lower portions of the propagation regions 32.

Further, according to the present embodiment, the frequency of diode operation can be increased. When a forward bias is applied to pass a forward current, hole injection occurs, and accordingly the holes are accumulated in the drift layer. Thereafter, when a backward bias is applied to widen a depletion layer in the drift layer to perform operation for obtaining a withstand voltage, it is necessary to discharge the holes accumulated during the forward bias from the drift layer. At this occasion, the hole discharge opening is the anode electrode via the p+ type impurity region, but since there is the propagation region sandwiched by the n-type impurity regions, the hole discharge opening increases in effect. Therefore, it is easy to discharge holes, and the frequency of the diode operation can be increased.

Figure 16:
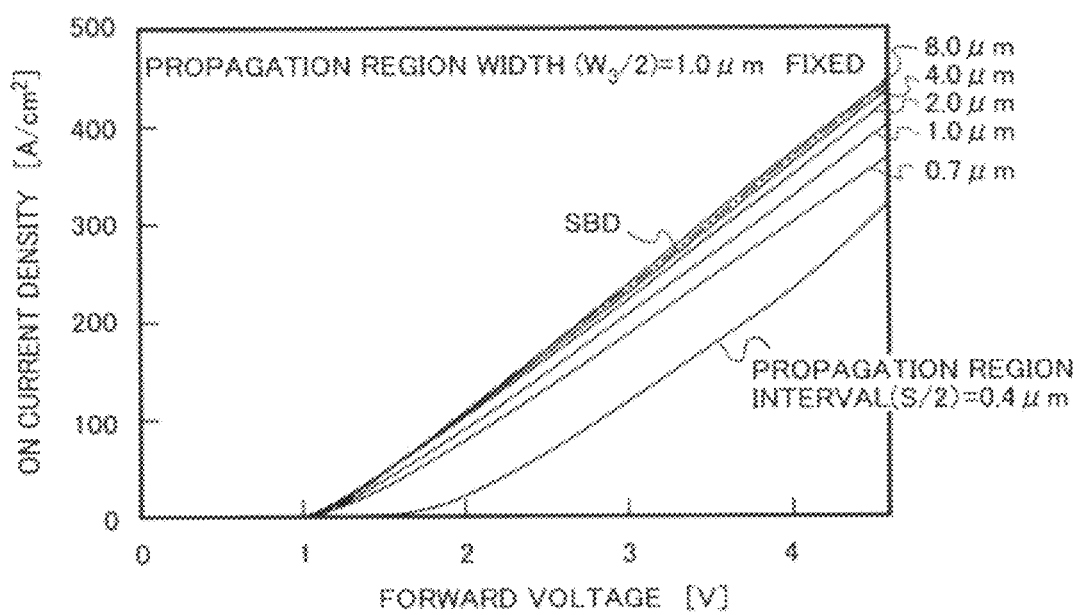
FIG. 16 is a figure illustrating a simulation result of propagation region interval dependency of ON-current density in the semiconductor rectifier device according to the second embodiment.

FIG. 16 is a figure illustrating a simulation result of propagation region interval dependency of ON-current density in the semiconductor rectifier device according to the second embodiment. The simulation is executed in a simplified structure including only the propagation region and the n-type impurity region. The half of the width of the propagation region 32 ($W_3/2$) is fixed to 1.0 μm. Then, the half of the interval of the propagation region (S/2: see FIG. 12) is adopted as a variable. As comparisons, this also shows a SBD without the propagation region.

As is evident from the figure, when the half of the interval of the propagation region is 4.0 μm or more, the ON-current density becomes the same as that of the SBD without the propagation region. Therefore, the total width of the propagation region interval is preferably 8.0 μm or more in order to ensure the ON-current density.

Further, the propagation region width is desirably 0.5 μm or more. When the propagation region width is less than 0.5 μm, it may be difficult to form a stable impurity region.

In the above explanation, for example, both ends of the propagation region are connected to the p+ type impurity regions. However, holes are propagated as long as a portion of the propagation region is connected to the p+ type impurity region. Therefore, for example, the propagation region may have such structure that one end of the propagation region is connected to the p+ type impurity region.

In the present embodiment, the first electrode 24 and the n-type impurity region 16 are desirably Schottky-connected, the first electrode 24 and the p+ type impurity region 18 are desirably ohmic-connected, and the first electrode 24 and the propagation region 32 are desirably ohmic-connected, so that the semiconductor rectifier device operates as the MPS and a surge current is effectively passed between the p+ type impurity region and the n-type impurity region.

As described above, according to the semiconductor rectifier device of the present embodiment, not only the effects of the first embodiment are obtained, but also the heating region can be dispersed when a forward surge current occurs. Therefore, the semiconductor rectifier device using the wide band gap semiconductor with improved surge current resistance and ON-current characteristic can be provided.

In the past, in a mode in which a PiN diode is used with a low current, the hole injection concentration is low, and therefore, when a switching occurs from backward bias to forward bias, holes rapidly disappear, and this causes a problem in that a large vibration waveform is generated. Therefore, since it is necessary to consider a time for converging the vibration waveform, this gets in the way of increasing the speed of an inverter and the like. However, according to the first and second embodiments, the semiconductor rectifier device operates in a bipolar mode in which hole injection occurs when the current density is high, and the semiconductor rectifier device can operate in a unipolar mode with an electron current when the current density is low. Therefore, the vibration at the low current density operation, which was the problem associated with the conventional PiN diode, can be suppressed, and the semiconductor rectifier device can be operated fast.

Third Embodiment

The semiconductor rectifier device according to the present embodiment is the same as the first embodiment except that the surface shape of a second semiconductor region is circle. Accordingly, the same contents as those of the first embodiment are omitted.

Figure 17:
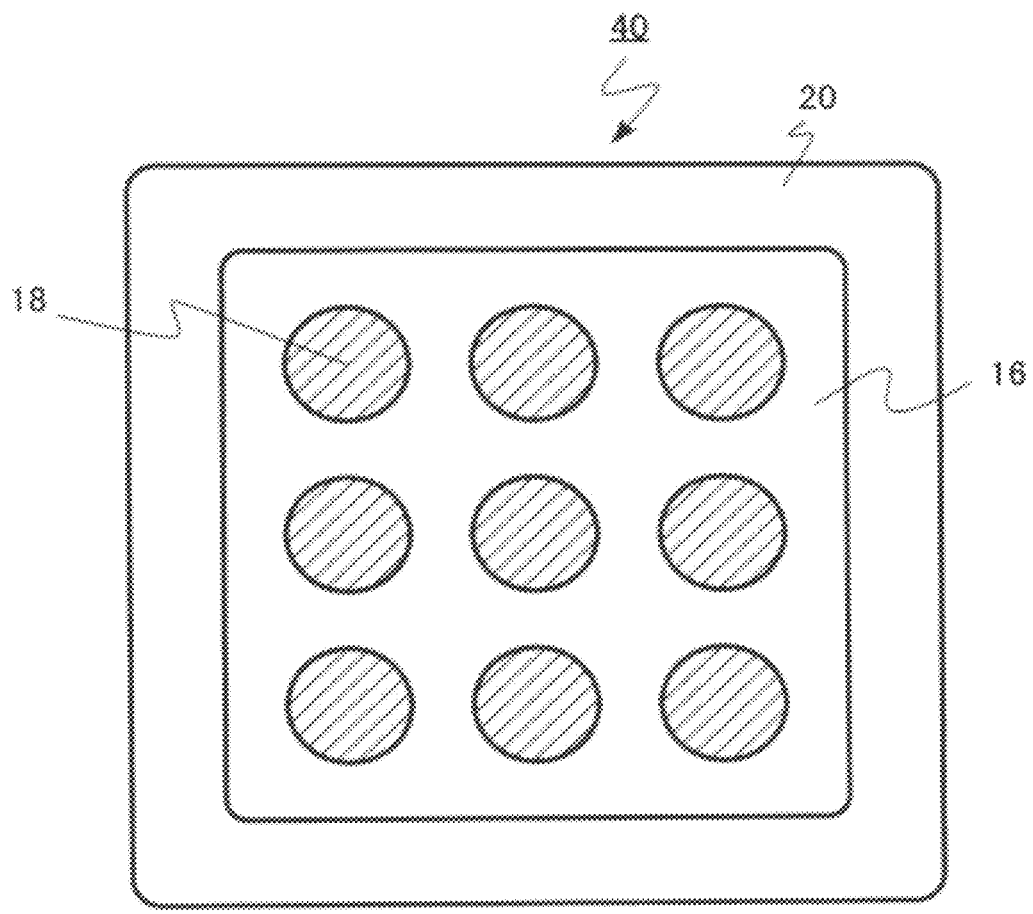
FIG. 17 is a top view illustrating a semiconductor rectifier device according to the third embodiment.

FIG. 17 is a schematic top view illustrating an MPS serving as a semiconductor rectifier device according to the present embodiment.

As shown in FIG. 17, in an n-type impurity region 16, a plurality of p+ type impurity regions 18 having a width (diameter) are formed. The surface shape of the p+ type impurity region 18 is circle, and the p+ type impurity regions 18 are arranged regularly. In this case, nine circular P+ type impurity regions 18 are formed with the same interval in the vertical and horizontal directions.

Further, at the outside of the n-type impurity region 16, a RESURF region 20 is formed to enclose the n-type impurity region 16. The region enclosed by the RESURF region 20 is an active region of the MPS.

The depth of the p+ type impurity region 18 is, for example, about 0.3 to 1.0 μm. The width or the diameter of the circle of the p+ type impurity region 18 is 15 μm or more. The concentration of the p+ type impurity region 18 is desirably as high as possible in order to cause the characteristic of the junction with the first electrode to be ohmic or almost ohmic.

When the width of the p+ type impurity region 18 is less than 15 μm, the hole injection voltage cannot be sufficiently reduced, and the resistance against the forward surge current may be degraded.

In an MPS 40 according to the present embodiment, the surface shape of the p+ type impurity region 18 is circle, so that while the forward surge current resistance is maintained, the size of occupied area of the p+ type impurity regions 18 in the active region is reduced, whereby the ON-current can be improved. The forward surge current resistance relies on the width of the p+ type impurity region 18. Therefore, when the shape of the p+ type impurity region 18 is made into circle, almost the same effects as those obtained from a rectangular/ stripe shape of the same width can be achieved while the p+ type impurity regions 18 occupy a smaller size of area.

Fourth Embodiment

The semiconductor rectifier device according to the present embodiment is the same as the third embodiment except that at least a portion is connected to the second semiconductor region, and the semiconductor rectifier device further includes a third semiconductor region of the second conductive type of a wide gap semiconductor having a narrower width than the second semiconductor region. Accordingly, the same contents as those of the third embodiment are omitted.

Figure 18:
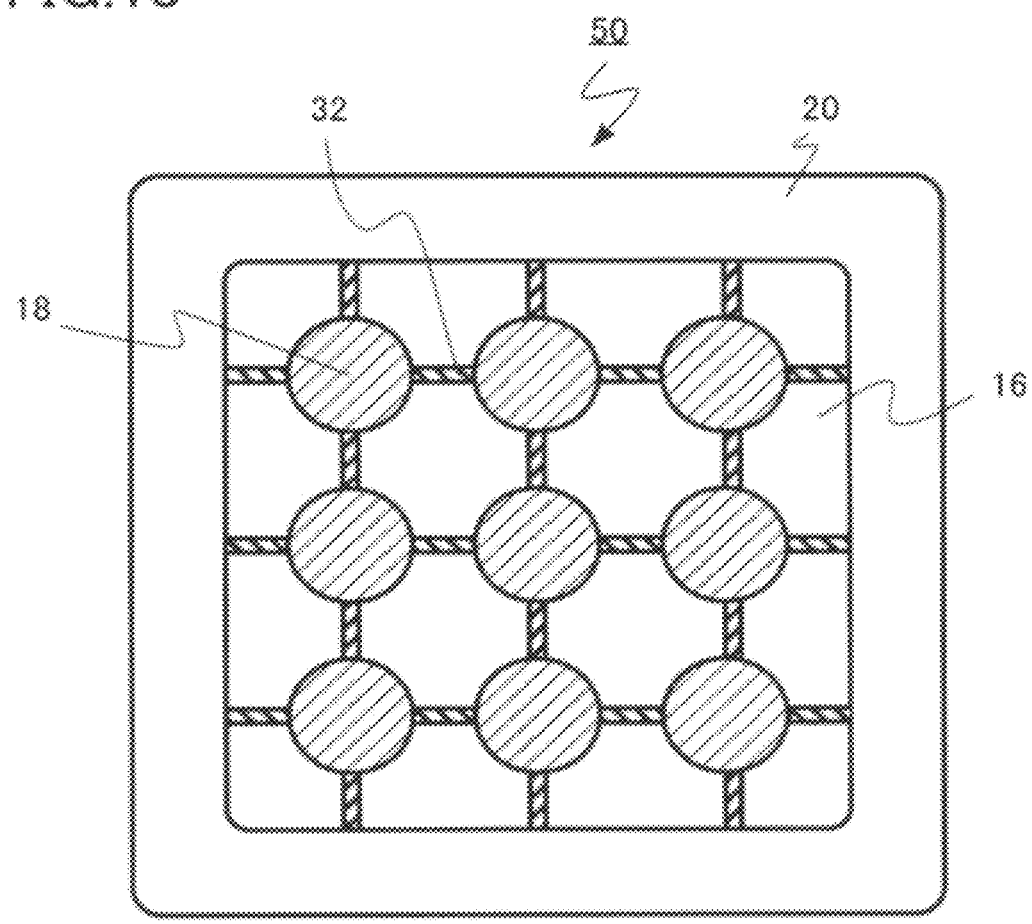
FIG. 18 is a top view illustrating a semiconductor rectifier device according to the fourth embodiment.

FIG. 18 is a schematic top view illustrating an MPS serving as a semiconductor rectifier device according to the present embodiment.

An MPS 50 of the present embodiment includes a plurality of p+ type propagation regions 32 both ends of which are connected to p+ type impurity regions 18 and each of which has a width narrower than the p+ type impurity region 18. The propagation region 32 is formed so as to be sandwiched by n-type impurity regions 16. In some propagation regions 32, an end thereof is connected to the p+ type impurity region 18, and the other end thereof is connected to a RESURF region 20.

Like the p+ type impurity region 18, the propagation region 32 is formed using ion injection of Al or B. The impurity concentration of the propagation region 32 is, for example, about 1E+18 atoms/cm$^3$, and the depth thereof is, for example, about 0.3 to 1.0 μm.

According to the present embodiment, the propagation regions 32 are provided, so that the hole injection is dispersed over a wide range of the activated region of the device. Therefore, the heating region can be dispersed, and the percent defective caused by the forward surge current can be further reduced.

The decrease of the ON-current density caused by the propagation regions 32 can be suppressed by reducing the width of the propagation region 32 to a width less than the p+ type impurity region 18. Further, according to the present embodiment, the frequency of diode operation can be increased.

Fifth Embodiment

The semiconductor rectifier device according to the present embodiment is the same as the fourth embodiment except that the semiconductor rectifier device further includes a fourth semiconductor region, the first semiconductor region being interposed between the forth semiconductor region and both the second semiconductor region and the third semiconductor region, and the forth semiconductor region being enclosed by the second semiconductor region and the third semiconductor region. Accordingly, the same contents as those of the fourth embodiment are omitted.

The semiconductor rectifier device according to the present embodiment has the above configuration. Accordingly, in the semiconductor rectifier device according to the present embodiment, the third wide band gap semiconductor region functions as a propagation region of holes generated in the second wide band gap semiconductor region. Therefore, the hole injection can be dispersed over a wide range of the activated region of the device. Therefore, the heating region of the device can be dispersed, and the percent defective caused by the forward surge current can be reduced. Further, since the fourth wide band gap semiconductor region is arranged, minority carriers generated in the second and third wide band gap semiconductor regions during forward bias can be discharged in a short time during turn-off. Therefore, the semiconductor rectifier device having superior turn-off characteristic is achieved. In addition, the surface shape of the second wide band gap semiconductor region is made into circle, so that dead space for the forward current is reduced, and the semiconductor rectifier device having a high ON-current can be achieved.

Further, in order to improve the turn-off characteristic the junction depth of the fourth wide band gap semiconductor region is desirably deeper than the junction depths of the second wide band gap semiconductor region and the third wide band gap semiconductor region.

Figure 19:
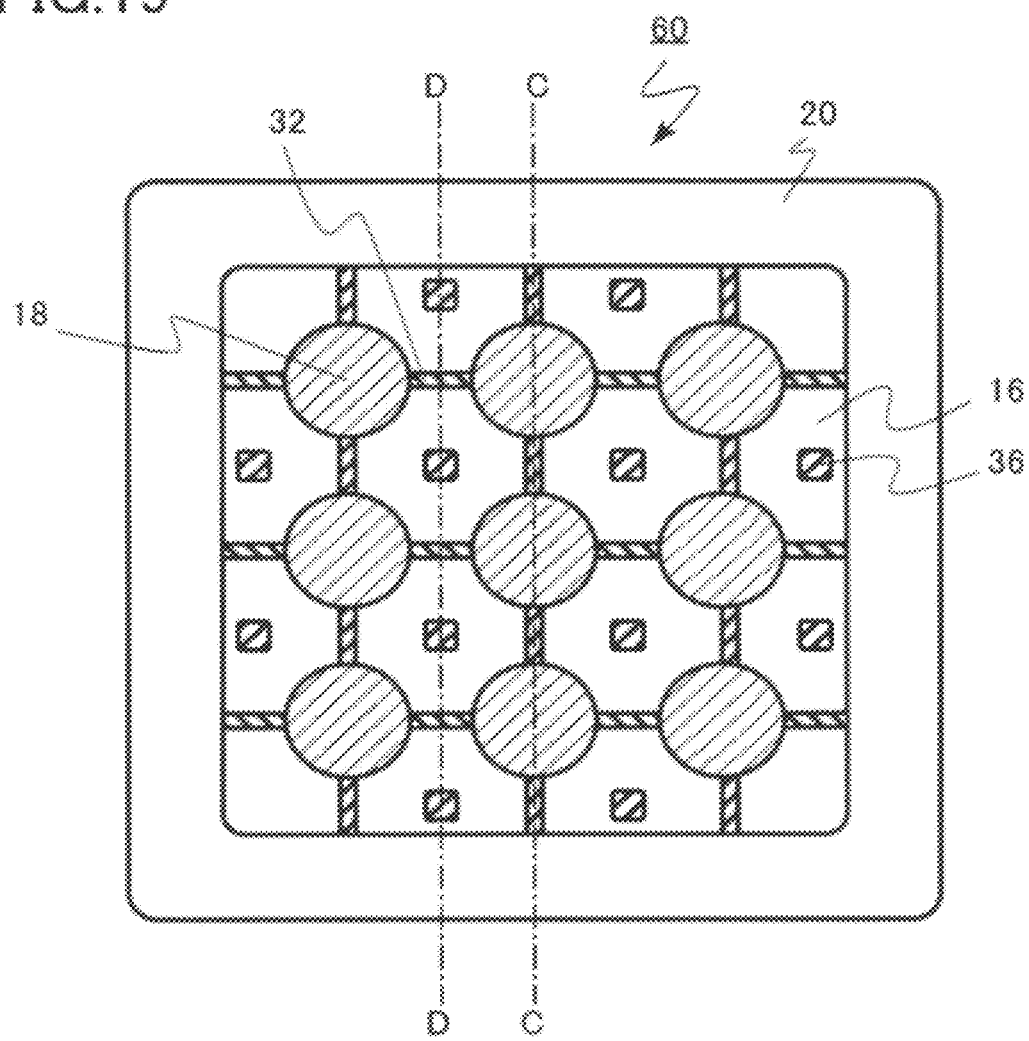
FIG. 19 is a top view illustrating a semiconductor rectifier device according to the fifth embodiment.
Figure 20A:
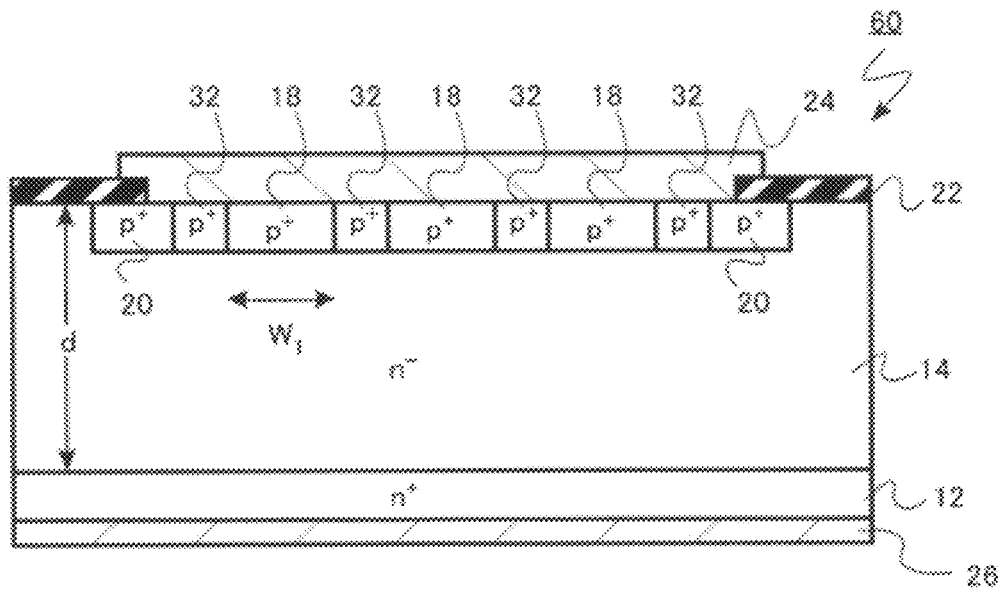
FIGS. 20A and 20B are top views each illustrating the semiconductor rectifier device according to the fifth embodiment.
Figure 20B:
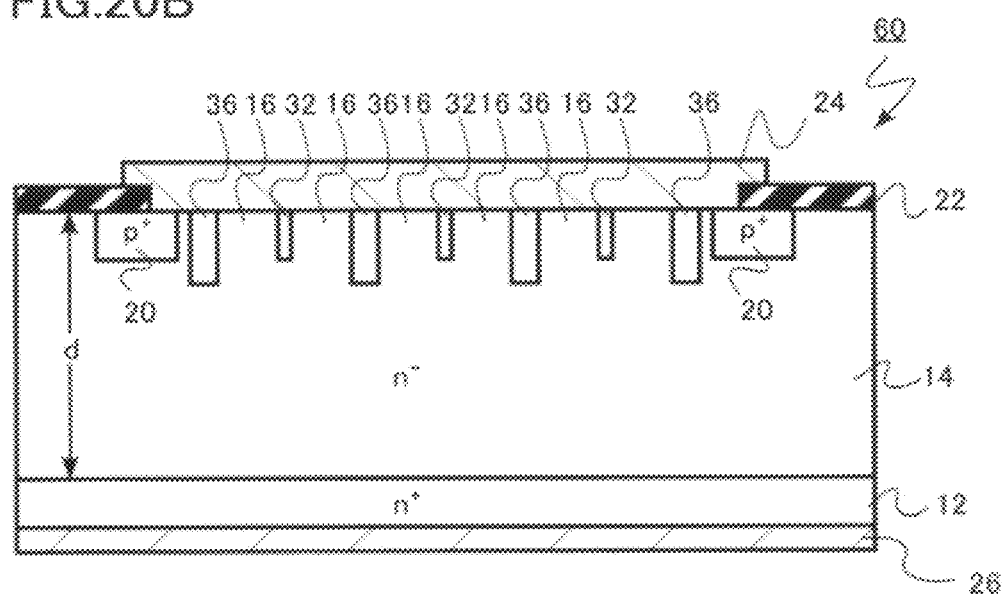

FIGS. 19, 20A, and 20B are a schematic top view and schematic cross sectional views, respectively, each illustrating an MPS serving as a semiconductor rectifier device according to the present embodiment. FIG. 20A is a cross sectional view taken along C-C of FIG. 19. FIG. 20B is a cross sectional view taken along D-D of FIG. 19.

As shown in FIG. 20, an MPS 60 according to the present embodiment has, for example, an n-type SiC layer 14 serving as a drift layer formed on an upper surface of an n+ type hexagonal 4H—SiC substrate 12. The 4H—SiC substrate 12 and the n-type SiC layer 14 include, for example, N (nitrogen) as impurity.

The n+ type 4H—SiC substrate 12 is a low resistance substrate, in which the impurity concentration is, for example, 5E+18 to 1E+19 atoms/cm$^3$. The impurity concentration of the n-type SiC layer 14 is, for example, between 1E+14 atoms/cm$^3$ and 5E+16 atoms/cm$^3$ inclusive, and the thickness thereof (denoted with "d" in FIG. 20) is 8 μm or more.

The n+ type 4H—SiC substrate 12 and the n-type SiC layer 14 has an off angle of 4 to 8 degrees with respect to <11-20> direction of SiC, for example.

On the surface of the n-type SiC layer 14, there is an n-type impurity region (n-type Schottky region) 16. The n-type impurity regions 16 correspond to an upper portion of the n-type SiC layer 14.

Each of p+ type impurity regions 18, whose surface shape is circle, is formed so as to be sandwiched between the n-type impurity regions 16, and the p+ type impurity region 18 includes, for example, about 1E+18 atoms/cm$^3$ of Al (aluminum) or B (boron) as impurity. Hereinafter, the p+ type impurity region 18 is also referred to as a hole generation region.

The depth of the p+ type impurity region 18 is, for example, about 0.3 to 1.0 μm. The width or the diameter of the circle (denoted with "$W_1$" in the figure) of the p+ type impurity region 18 is, for example, 15 μm or more. The concentration of the p+ type impurity region 18 is desirably as high as possible in order to cause the characteristic of the junction with the first electrode to be ohmic or almost ohmic.

When the width of the p+ type impurity region 18 (denoted with "$W_1$" in the figure) is less than 15 μm, the hole injection voltage cannot be sufficiently reduced, and the resistance against the forward surge current may be degraded.

At the outside of the p+ type impurity region 18, a RESURF region 20 is formed. The RESURF region 20 has, for example, about the same impurity concentration and depth as the p+ type impurity region 18. The RESURF region is arranged to stabilize the withstand voltage of the MPS.

The surface of the n-type SiC layer 14 is covered with an insulating film 22 made of, for example, silicon oxide film. A first electrode (anode electrode) 24 made of, for example, Ni is formed in an opening portion of the insulating film 22, so that the first electrode is joined with the n-type impurity regions 16 and the p+ type impurity regions 18. The first electrode (anode electrode) 24 is formed to be in contact with a portion of the RESURF region 20. Further, a second electrode (cathode electrode) 26 made of, for example, Ni is formed on a lower surface of the n+ type 4H—SiC substrate 12.

In the horizontal plane, as shown in FIG. 19, in the n-type impurity region 16, a plurality of p+ type impurity regions 18 having a width (diameter) $W_1$ are formed. The surface shape of the p+ type impurity region 18 is circle, and the p+ type impurity regions 18 are arranged regularly. In this case, nine circular p+ type impurity regions 18 are formed with the same interval in the vertical and horizontal directions.

Further, at the outside of the n-type impurity region 16, the RESURF region 20 is formed to enclose the n-type impurity region 16. The region enclosed by the RESURF region 20 is an active region of the MPS.

An MPS 600 of the present embodiment includes a plurality of p+ type propagation regions 32 both ends of which are connected to the p+ type impurity regions 18 and each of which has a width narrower than the p+ type impurity region 18. The propagation region 32 is formed so as to be sandwiched by n-type impurity regions 16. In some propagation regions 32, an end thereof is connected to the p+ type impurity region 18, and the other end thereof is connected to the RESURF region 20.

Like the p+ type impurity region 18, the propagation region 32 is formed using ion injection of Al or B. The impurity concentration of the propagation region 32 is, for example, about 1E+18 atoms/cm$^3$, and the depth thereof is, for example, about 0.3 to 1.0 μm.

Further, the MPS 600 includes island-like p+ type hole discharge regions 36 enclosed by the p+ type impurity regions 18 and the p+ type propagation regions 32. The p+ type hole discharge region 36 is formed via the p+ type impurity region 18, the p+ type propagation region 32, and the n-type impurity region 16.

Like the p+ type impurity region 18 and the propagation region 32, the hole discharge region 36 is formed using ion injection of Al or B. For example, the impurity concentration of the hole discharge region 36 is about 1E+18 atoms/cm$^3$, and the depth thereof is desirably deeper than the p+ type impurity region 18 and the propagation region 32. For example, it is about 0.5 to 2.0 μm.

Figure 21A:
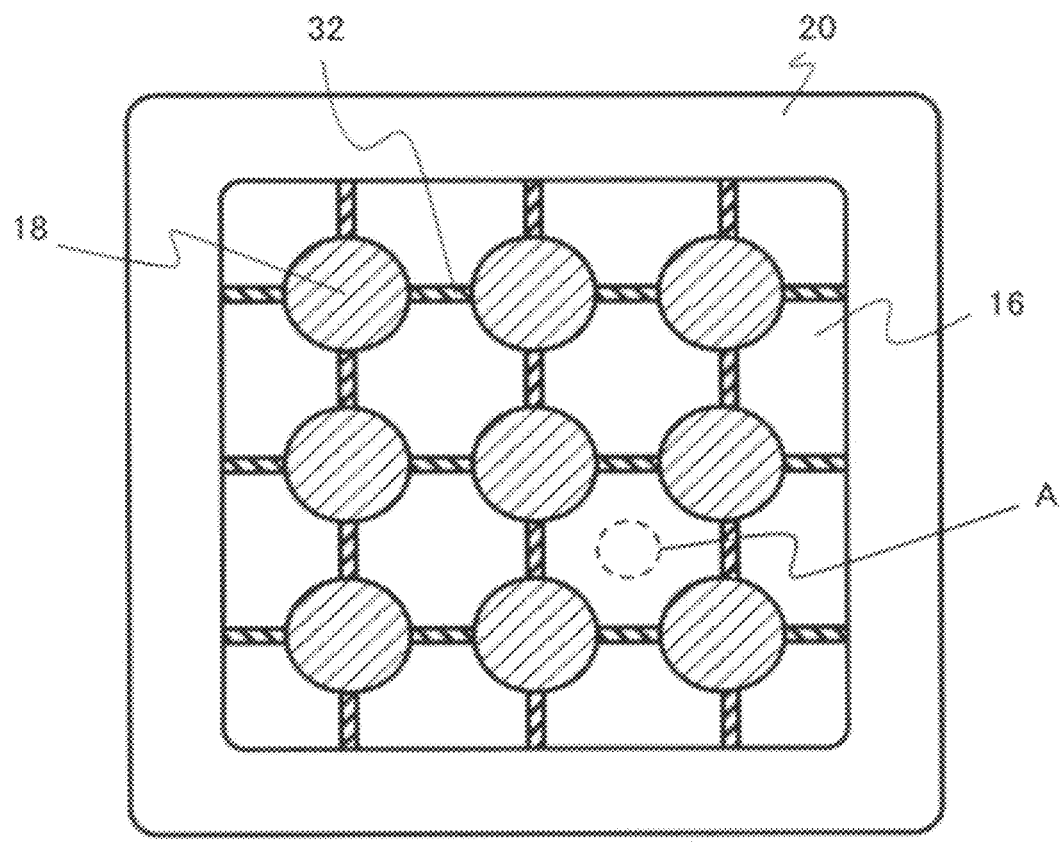
FIGS. 21A and 21B are explanatory diagrams of an effect of the semiconductor rectifier device according to the fifth embodiment.
Figure 21B:
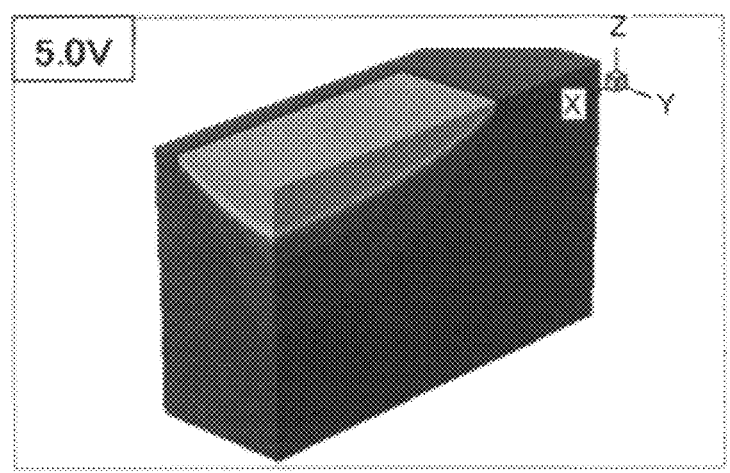
Figure 23:
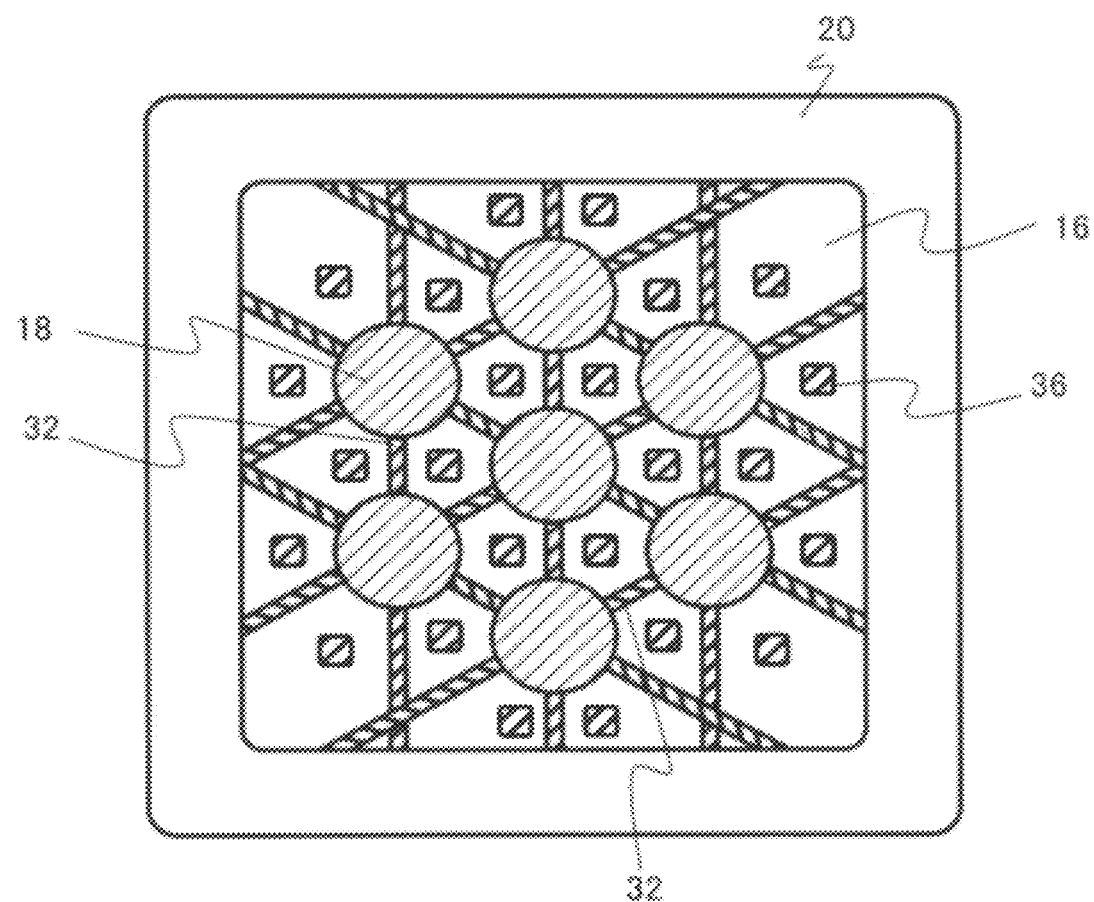
FIG. 23 is a top view illustrating a semiconductor rectifier device according to a modification of the fifth embodiment.

FIGS. 21A and 21B are figures illustrating an effect of an MPS of the present embodiment. FIG. 21A is a device having a pattern from which the hole discharge regions 36 are deleted as compared with the MPS 60 according to the present embodiment as shown in FIG. 23. FIG. 21B is a simulation result of hole concentration in a region A when a forward bias of 5.0 V is applied to the MPS having the pattern as shown in FIG. 21A.

First, since the MPS 60 has the p+ type impurity region 18, the hole injection voltage is reduced, and the forward surge current resistance is improved. The width or diameter (denoted with "$W_1$" in the figure) of the p+ type impurity region 18 is desirably 15 μm or more in order to improve the surge current. The concentration of the p+ type impurity region 18 is desirably as high as possible in order to cause the characteristic of the junction with the first electrode to be ohmic or almost ohmic.

In the MPS 60, the surface shape of the p+ type impurity region 18 is circle, so that while the forward surge current resistance is maintained, the size of occupied area of the p+ type impurity regions 18 in the active region is reduced, whereby the ON-current can be improved. The forward surge current resistance relies on the width of the p+ type impurity region 18. Therefore, when the shape of the p+ type impurity region 18 is made into circle, almost the same effects as those obtained from a rectangular/stripe shape of the same width can be achieved while the p+ type impurity regions 18 occupy a smaller size of area.

Further, in the MPS 60, the propagation region 32 is provided to connect the p+ type impurity regions 18, so that the heating region of the device can be dispersed, and the percent defective caused by the forward surge current can be reduced.

Moreover, in this structure, i.e., the structure of FIG. 21A, high concentration holes are accumulated as shown in FIG. 21B in the region A indicated by the broken line in FIG. 21A. Therefore, it takes some time to discharge holes accumulated in this region during turn-off of the device, and this causes a problem in that the turn-off characteristic of the MPS is degraded.

In the present embodiment, the p+ type hole discharge regions 36 are provided. Since the p+ type hole discharge regions 36 are provided, it takes a shorter time to discharge the holes accumulated in the region A, and this improves the turn-off characteristic.

Therefore, according to the present embodiment, the semiconductor rectifier device with superior surge current resistance, improved ON-current, and superior turn-off characteristic is achieved.

As described above, the depth of the hole discharge region 36 is desirably deeper than the p+ type impurity region 18 and the propagation region 32. As shown in FIG. 21B, the high concentration holes extend widthwisely and flow from the p-type region (the p+ type impurity region, the propagation region) of the anode to the cathode region. At this occasion, for example, in a region away from the p– type region such as the region A of FIG. 21A, the holes are accumulated in a portion lower than the lower portion of the anode in the depth direction. Therefore, when the hole discharge region is arranged at the same depth as the P-type region of the anode, the discharge efficiency is degraded. Therefore, the hole discharge region 36 is set at a depth deeper than the p+ type impurity region 18 and the propagation region 32, so that the discharge efficiency of the holes can be improved.

Figure 22:
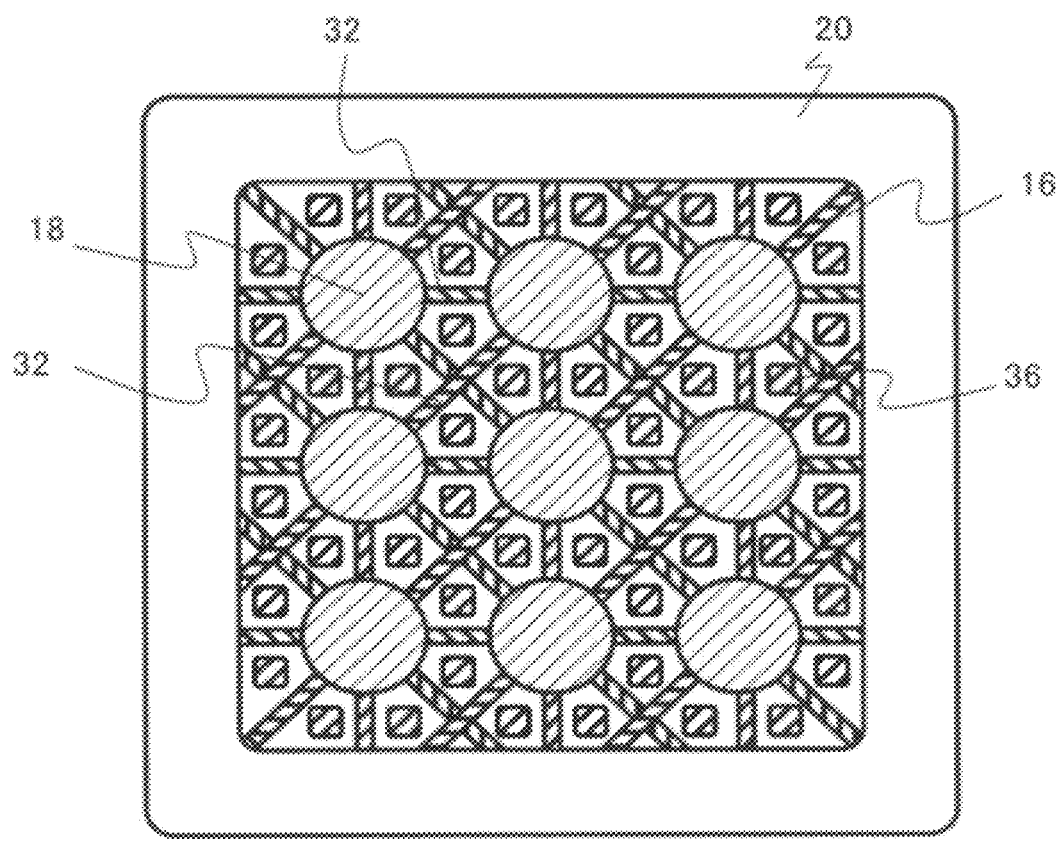
FIG. 22 is a top view illustrating a semiconductor rectifier device according to a modification of the fifth embodiment.

FIG. 22 is a figure illustrating the first modification of the semiconductor device according to the present embodiment. As compared with the MPS of FIG. 21, a propagation regions 32 for diagonally connecting p+ type impurity regions 18 are further provided. According to the present modification, the heating region of the device is further dispersed, and the percent defective caused by the forward surge current can be further reduced.

FIG. 22 is a figure illustrating the second modification of the semiconductor device according to the present embodiment. As compared with the MPS of FIG. 22, arrangement of the p+ type impurity regions 18 are changed. According to the present modification, the same effects as those of the MPS of FIG. 22 are also expected.

Sixth Embodiment

The semiconductor rectifier device according to the present embodiment is the same as the first embodiment in that the semiconductor rectifier device includes a fifth semiconductor region of the second conductive type, provided between the first semiconductor region and the first electrode, that is arranged shallower than the second semiconductor region and has a lower impurity concentration than the second semiconductor region. Accordingly, the same contents as those of the first embodiment are omitted. It should be noted that the first electrode and the fifth semiconductor region are Schottky-connected.

Since the semiconductor rectifier device according to the present embodiment has the above configuration, a forward rising voltage (voltage indicated by arrow a in FIG. 3) can be adjusted to a desired value.

Hereinafter, for example, an MPS will be explained in which a wide band gap semiconductor is silicon carbide (which may be hereinafter referred to as SiC), the first conductive type is n-type, and the second conductive type is p-type.

Figure 24:
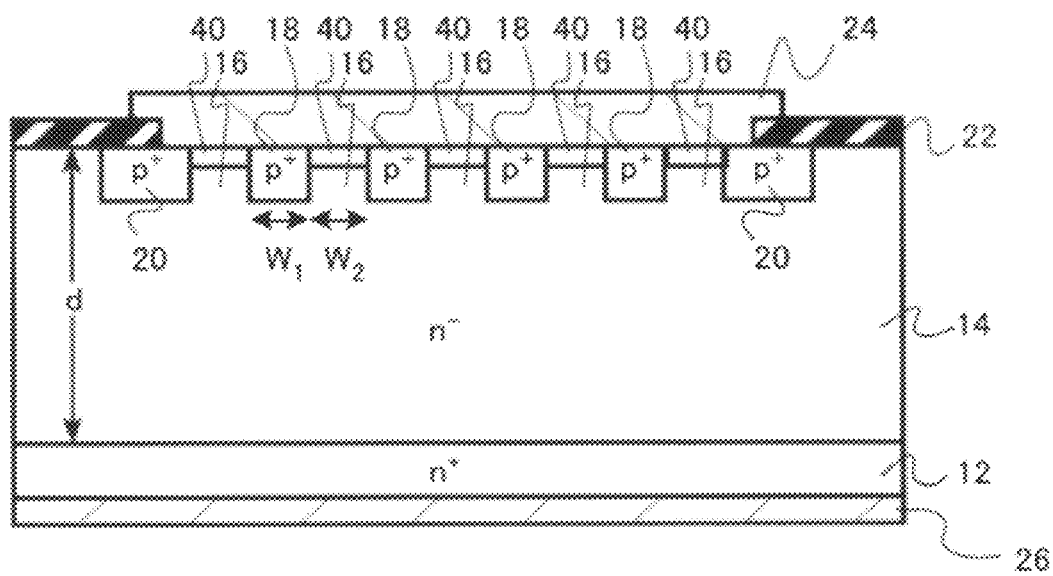
FIG. 24 is a cross sectional view illustrating a semiconductor rectifier device according to the sixth embodiment.

FIG. 24 is a schematic cross sectional view illustrating an MPS, i.e., a semiconductor rectifier device according to the present embodiment.

As shown in FIG. 24, on the surface of an n-type SiC layer 14, there are n-type impurity regions (n-type Schottky regions: first semiconductor regions) 16. The n-type impurity regions 16 correspond to an upper portion of the n-type SiC layer 14.

Further, p-type impurity regions (fifth semiconductor regions) 40 are formed between the n-type impurity regions (n-type Schottky regions: first semiconductor regions) 16 and a first electrode (anode electrode) 24. The p-type impurity region (fifth semiconductor region) 40 has a shallower junction depth than a p+ type impurity region (second semiconductor region) 18. The p-type impurity region (fifth semiconductor region) 40 is formed to have a lower P type impurity concentration than the P+ type impurity region (second semiconductor region) 18.

For example, the depth of the p-type impurity region (fifth semiconductor region) 40 is about 20 to 100 nm. For example, the p-type impurity concentration is about 5E+16 to 1E+18 atoms/cm$^3$.

The first electrode (anode electrode) 24 and the P-type impurity region (fifth semiconductor region) 40 are Schottky-connected. The electrode material, the impurity concentration, process thermal history, and the like are set in order to make Schottky connection.

According to the present embodiment, the junction depth and the impurity concentration of the p-type impurity regions (fifth semiconductor regions) 40 are appropriately selected, so that the barrier heights of the p-type impurity regions (fifth semiconductor regions) 40 are adjusted. Accordingly, the forward rising voltage (voltage indicated by arrow a in FIG. 3) can be adjusted to a desired value.

Seventh Embodiment

The semiconductor rectifier device according to the present embodiment is the same as the sixth embodiment except that the first electrode and the fifth semiconductor region are ohmic-connected. Accordingly, the same contents as those of the sixth embodiment are omitted.

A first electrode (anode electrode) 24 and p-type impurity regions (fifth semiconductor regions) 40 are ohmic-connected. The electrode material, the impurity concentration, process thermal history, and the like are set in order to make ohmic connection.

According to the present embodiment, the junction depth and the impurity concentration of the p-type impurity regions (fifth semiconductor regions) 40 are appropriately selected, so that the barrier heights of the p-type impurity regions (fifth semiconductor regions) 40 are adjusted. Accordingly, the forward rising voltage (voltage indicated by arrow a in FIG. 3) can be adjusted to a desired value.

Eighth Embodiment

The semiconductor rectifier device according to the present embodiment is the same as the first embodiment in that the semiconductor rectifier device includes a fifth semiconductor region of the second conductive type, provided between the first semiconductor region and the first electrode, that has a lower impurity concentration than the second semiconductor region, the semiconductor rectifier device further includes a sixth semiconductor region of the first conductive type provided between the first electrode and the fifth semiconductor region, and the first electrode and the sixth semiconductor region are ohmic-connected. Accordingly, the same contents as those of the first embodiment are omitted.

Since the semiconductor rectifier device according to the present embodiment has the above configuration, a forward rising voltage (voltage indicated by arrow a in FIG. 3) can be adjusted to a desired value.

Hereinafter, for example, an MPS will be explained in which a wide band gap semiconductor is silicon carbide (which may be hereinafter referred to as SiC), the first conductive type is n-type, and the second conductive type is p-type.

Figure 25:
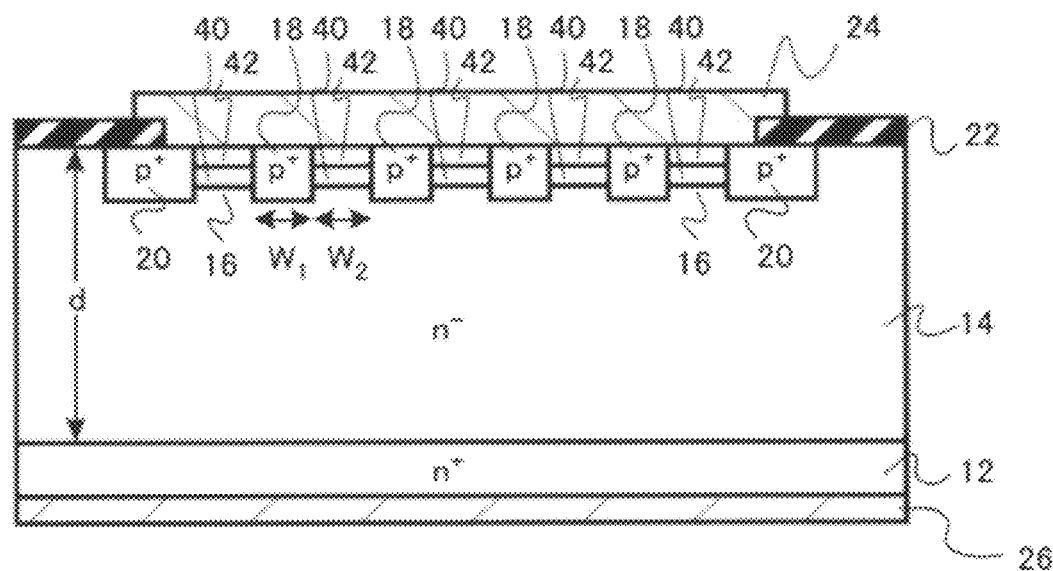
FIG. 25 is a cross sectional view illustrating a semiconductor rectifier device according to the eighth embodiment.

FIG. 25 is a schematic cross sectional view illustrating an MPS, i.e., a semiconductor rectifier device according to the present embodiment.

As shown in FIG. 25, on the surface of an n-type SiC layer 14, there are n-type impurity regions (n-type Schottky regions: first semiconductor regions) 16. The n-type impurity regions 16 correspond to an upper portion of the n-type SiC layer 14.

Further, p-type impurity regions (fifth semiconductor regions) 40 are formed between the n-type impurity regions (n-type Schottky regions: first semiconductor regions) 16 and a first electrode (anode electrode) 24. The p-type impurity region (fifth semiconductor region) 40 is formed to have a lower-type impurity concentration than a p+ type impurity region (second semiconductor region) 18.

For example, the depth of the p-type impurity region (fifth semiconductor region) 40 is about 20 to 100 nm. For example, the P-type impurity concentration is about 5E+16 to 1E+18 atoms/cm$^3$.

Further, n-type impurity regions (sixth semiconductor regions) 42 are provided between the first electrode (anode electrode) 24 and the p-type impurity regions (fifth semiconductor regions) 40. The n-type impurity concentration is, for example, about 1E+18 to 1E+20 atoms/cm$^3$.

The first electrode (anode electrode) 24 and the n-type impurity regions (sixth semiconductor regions) 42 are ohmic-connected. The electrode material, the impurity concentration, process thermal history, and the like are set in order to make ohmic connection.

According to the present embodiment, the junction depth and the impurity concentration of the p-type impurity regions (fifth semiconductor regions) 40 and the n-type impurity regions (sixth semiconductor regions) 42 are appropriately selected, so that the barrier heights are adjusted, and the forward rising voltage (voltage indicated by arrow a in FIG. 3) can be adjusted to a desired value and reduced.

Ninth Embodiment

The semiconductor rectifier device according to the present embodiment is the same as the first embodiment in that the semiconductor rectifier device includes an eighth semiconductor region of the first conductive type, provided between the first semiconductor region and the first electrode, that has a lower impurity concentration than the first semiconductor region. Accordingly, the same contents as those of the first embodiment are omitted.

Since the semiconductor rectifier device according to the present embodiment has the above configuration, a forward rising voltage (voltage indicated by arrow a in FIG. 3) can be reduced.

Hereinafter, for example, an MPS will be explained in which a wide band gap semiconductor is silicon carbide (which may be hereinafter referred to as SiC), the first conductive type is n-type, and the second conductive type is p-type.

Figure 26:
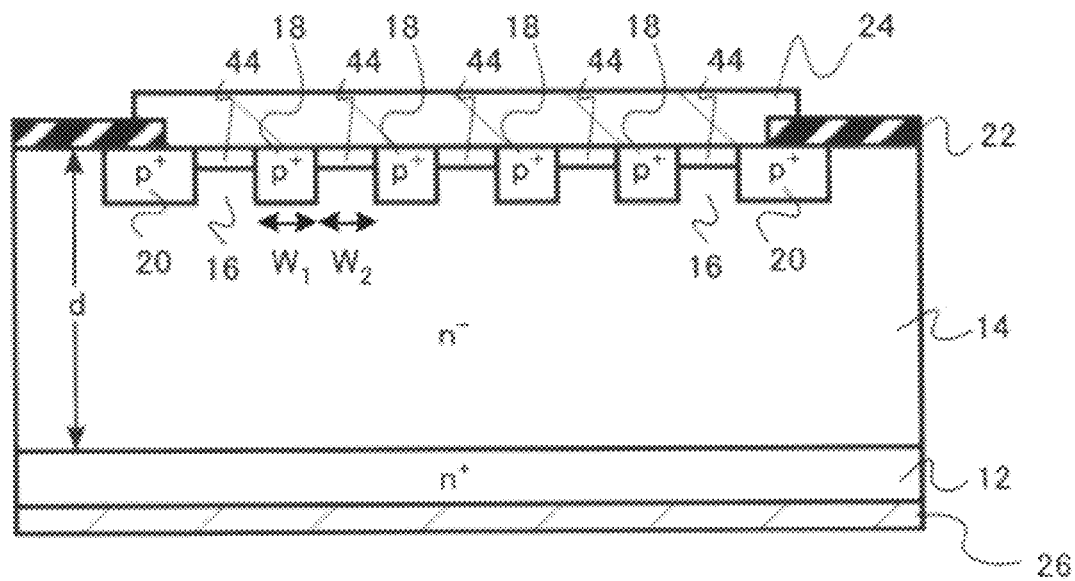
FIG. 26 is a cross sectional view illustrating a semiconductor rectifier device according to the ninth embodiment.

FIG. 26 is a schematic cross sectional view illustrating an MPS, i.e., a semiconductor rectifier device according to the present embodiment.

As shown in FIG. 26, on the surface of an n-type SiC layer 14, there are n-type impurity regions (N-type Schottky regions: first semiconductor regions) 16. The n-type impurity regions 16 correspond to an upper portion of the n-type SiC layer 14.

Further, n-type impurity regions (seventh semiconductor regions) 44 having a higher n-type impurity concentration than the n-type impurity regions (first semiconductor regions) 16 are formed between the n-type impurity regions (n-type Schottky region: first semiconductor regions) 16 and a first electrode (anode electrode) 24.

The n-type impurity concentration of the n-type impurity region (seventh semiconductor region) 40 is, for example, about 1E+16 to 1E+19 atoms/cm$^3$.

According to the present embodiment, the n-type impurity regions (seventh semiconductor regions) 44 are provided, so that Fermi level at the side of the semiconductor decreases, which easily allows tunnel current to flow between the n-type impurity regions (first semiconductor regions) 16 and the first electrode (anode electrode) 24. Therefore, the forward rising voltage (voltage indicated by arrow a in FIG. 3) can be reduced. The reduction width of the rising voltage can be achieved by adjusting the n-type impurity concentration of the n-type impurity regions (seventh semiconductor regions) 44.

Tenth Embodiment

The semiconductor rectifier device according to the present embodiment is the same as the first embodiment except that the second electrode is not provided on the semiconductor substrate but is provided on the lower surface of the semiconductor layer. Accordingly, the same contents as those of the first embodiment are omitted.

Figure 27:
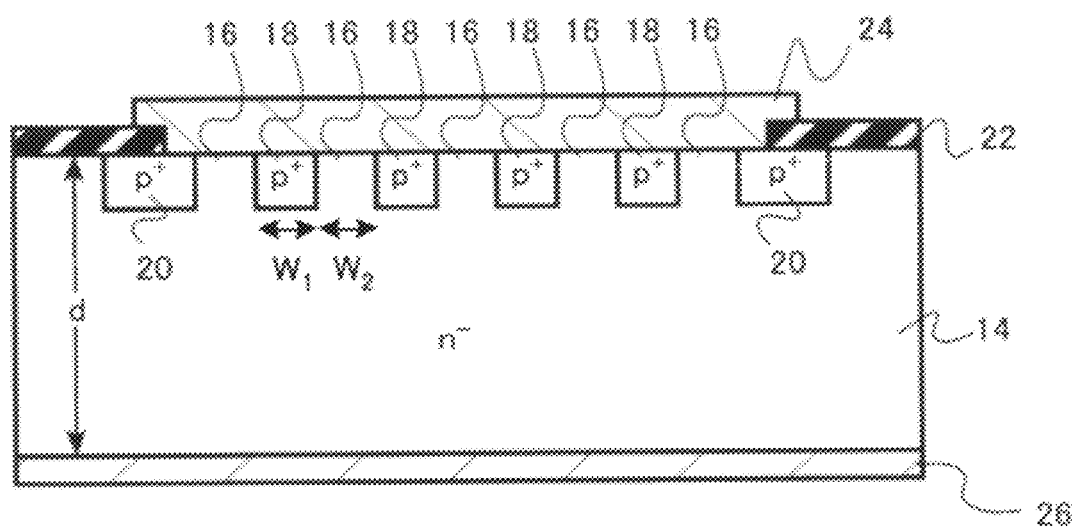
FIG. 27 is a cross sectional view illustrating a semiconductor rectifier device according to the tenth embodiment.

FIG. 27 is a cross sectional view illustrating a semiconductor rectifier device according to the present embodiment. The semiconductor rectifier device according to the present embodiment is the same as the first embodiment except that a second electrode (cathode electrode) 26 is provided on the lower surface of an N-type SiC layer 14. As compared with the first embodiment as shown in FIG. 1, the thickness decreases due to the absence of an n+ type 4H—SiC substrate 12, and this achieves low resistance. The semiconductor rectifier device according to the present embodiment can be manufactured by grinding and removing the n+ type 4H—SiC substrate 12 before the second electrode (cathode electrode) 26 is formed.

While certain embodiments have been described, these embodiments have been presented by way of example only, and are not intended to limit the scope of the inventions. Indeed, the semiconductor rectifier device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, in the explanation about the embodiments, the semiconductor rectifier device has been explained in which the first conductive type is the n-type and the second conductive type is the p-type. Alternatively, in the semiconductor rectifier device, the first conductive type may be the p-type, and the second conductive type may be the n-type.

In the explanation about the embodiments, two p+ type impurity regions basically in the square and circular shapes have been explained, for example. However, the shape may be other shapes such as stripe, grid, dot-shaped, rectangular, hexagonal, polygonal, ring shapes having desired widths. On the other hand, the number of regions may be one, or two or more. However, it is desired to have at least a plurality of p+ type impurity regions in order to disperse the heating region.

In the embodiments, the silicon carbide (SiC) has been explained as an example of the wide band gap semiconductor. However, other wide band gap semiconductors such as diamond and gallium nitride (GaN) can be employed.

In the explanation about the first electrode, for example, Ni and Ti/Al are used as materials. However, other materials such as Mo, W, Pt, Ta, TaN, alloys thereof, silicide, and carbide can be used in order to obtain the Schottky barrier height ($\phi B$) and the contact resistance required as the MPS.

What is claimed is:

1. A semiconductor rectifier device comprising:
    a semiconductor substrate of a first conductive type of a wide gap semiconductor;
    a semiconductor layer of the first conductive type of the wide gap semiconductor formed on an upper surface of the semiconductor substrate, wherein an impurity concentration of the semiconductor layer is between 1E+14 atoms/cm$^3$ and 5E+16 atoms/cm$^3$ inclusive, and a thickness thereof is 8 µm or more;
    a first semiconductor region of the first conductive type of the wide gap semiconductor formed at the semiconductor layer surface;
    a plurality of second semiconductor regions of a second conductive type of the wide gap semiconductor formed as sandwiched by the first semiconductor regions, wherein a width of each of the second semiconductor regions is 15 µm or more;
    a further semiconductor region of the second conductive type of the wide gap semiconductor formed outside of the second semiconductor regions, the further semiconductor region having a width wider than the second semiconductor regions;
    an insulating film covering a part of the further semiconductor region;
    a first electrode formed in an opening of the insulating film, the first electrode being formed on an entire surface of the first and second semiconductor regions, the first electrode being formed on only a part of a surface of the further semiconductor region; and
    a second electrode formed on a lower surface of the semiconductor substrate.

2. The device according to claim 1, wherein a surface shape of the second semiconductor region is a circle.

3. The device according to claim 1, wherein the thickness of the semiconductor layer is 20 µm or more.

4. The device according to claim 1 further comprising a third semiconductor region of the second conductive type of a wide gap semiconductor having a width narrower than the second semiconductor region, wherein at least a portion thereof is connected to the second semiconductor region.

5. The device according to claim 1 further comprising a fourth semiconductor region of the second conductive type of a wide gap semiconductor, the first semiconductor region being interposed between the forth semiconductor region and both the second semiconductor region and the third semiconductor region, and the forth semiconductor region being enclosed by the second semiconductor region and the third semiconductor region.

6. The device according to claim 5, wherein a junction depth of the fourth semiconductor region is deeper than junction depths of the second semiconductor region and the third semiconductor region.

7. The device according to claim 1, wherein the first electrode and the first semiconductor region is Schottky-connected, and the first electrode and each of the second semiconductor regions are ohmic-connected.

8. The device according to claim 4, wherein the first electrode and the first semiconductor region are Schottky-connected, the first electrode and the second semiconductor region are ohmic-connected, and the first electrode and the third semiconductor region are ohmic-connected.

9. The device according to claim 1, wherein the wide band gap semiconductor is silicon carbide (SiC).

10. The device according to claim 1 further comprising a fifth semiconductor region of the second conductive type, provided between the first semiconductor region and the first electrode, that is shallower than the second semiconductor region and has a lower impurity concentration than the second semiconductor region.

11. The device according to claim 10, wherein the first electrode and the fifth semiconductor region are Schottky-connected.

12. The device according to claim 10, wherein the first electrode and the fifth semiconductor region are ohmic-connected.

13. The device according to claim 10 further comprising a sixth semiconductor region of the first conductive type provided between the first electrode and the fifth semiconductor region, wherein the first electrode and the sixth semiconductor region are ohmic-connected.

14. The device according to claim 1 further comprising a seventh semiconductor region of the first conductive type provided between the first semiconductor region and the first electrode and having a higher impurity concentration than the first semiconductor region.

15. A semiconductor rectifier device comprising:
a semiconductor layer of a first conductive type of a wide gap semiconductor, wherein an impurity concentration the semiconductor layer is between 1E+14 atoms/cm$^3$ and 5E+16 atoms/cm$^3$ inclusive, and a thickness thereof is 8 µm or more;
a first semiconductor region of the first conductive type of the wide gap semiconductor formed at the semiconductor layer surface;
a plurality of second semiconductor regions of a second conductive type of the wide gap semiconductor formed as sandwiched by the first semiconductor regions, wherein a width of each of the second semiconductor regions is 15 µm or more;
a further semiconductor region of the second conductive type of the wide gap semiconductor formed outside of the second semiconductor regions, the further semiconductor region having a width wider than the second semiconductor regions;
an insulating film covering a part of the further semiconductor region;
a first electrode formed in an opening of the insulating film, the first electrode being formed on an entire surface of the first and second semiconductor regions, the first electrode being formed on only a part of a surface of the further semiconductor region; and
a second electrode formed on a lower surface of the semiconductor layer.

16. The device according to claim 15, wherein a surface shape of the second semiconductor region is a circle.

17. The device according to claim 1, wherein the first electrode having a Schottky electrode and an ohmic electrode which are made of different materials, the Schottky electrode being formed on the first semiconductor region, the ohmic electrode being formed on each of the second semiconductor regions, the Schottky electrode and the first semiconductor region is Schottky-connected, and the ohmic electrode and each of the second semiconductor regions is ohmic-connected.

18. The device according to claim 15, wherein the first electrode having a Schottky electrode and an ohmic electrode which are made of different materials, the Schottky electrode being formed on the first semiconductor region, the ohmic electrode being formed on each of the second semiconductor regions, the Schottky electrode and the first semiconductor region is Schottky-connected, and the ohmic electrode and each of the second semiconductor regions is ohmic-connected.

19. A semiconductor rectifier device comprising:
a semiconductor substrate of a first conductive type of a wide gap semiconductor;
a semiconductor layer of the first conductive type of the wide gap semiconductor formed on an upper surface of the semiconductor substrate, wherein an impurity concentration of the semiconductor layer is between 1E+14 atoms/cm$^3$ and 5E+16 atoms/cm$^3$ inclusive, and a thickness thereof is 8 µm or more;
a first semiconductor region of the first conductive type of the wide gap semiconductor formed at the semiconductor layer surface;
a plurality of second semiconductor regions of a second conductive type of the wide gap semiconductor formed as sandwiched by the first semiconductor regions, wherein a width of each of the second semiconductor regions is 36 µm or more, and the width of each of the second semiconductor regions is wider than a width of each of the first semiconductor regions;
a further semiconductor region of the second conductive type of the wide gap semiconductor formed outside of the second semiconductor regions, the further semiconductor region having a width wider than the second semiconductor regions;
an insulating film covering a part of the further semiconductor region;
a first electrode formed in an opening of the insulating film, the first electrode being formed on an entire surface of the first and second semiconductor regions, the first electrode being formed on only a part of a surface of the further semiconductor region; and
a second electrode formed on a lower surface of the semiconductor substrate.

20. A semiconductor rectifier device comprising:
- a semiconductor layer of a first conductive type of a wide gap semiconductor, wherein an impurity concentration of the semiconductor layer is between $1E+14$ atoms/cm$^3$ and $5E+16$ atoms/cm$^3$ inclusive, and a thickness thereof is 8 μm or more;
- a first semiconductor region of the first conductive type of the wide gap semiconductor formed at the semiconductor layer surface;
- a plurality of second semiconductor regions of a second conductive type of the wide gap semiconductor formed as sandwiched by the first semiconductor regions, wherein a width of each of the second semiconductor regions is 36 μm or more, and the width of each of the second semiconductor regions is wider than a width of each of the first semiconductor regions;
- a further semiconductor region of the second conductive type of the wide gap semiconductor formed outside of the second semiconductor regions, the further semiconductor region having a width wider than the second semiconductor regions;
- an insulating film covering a part of the further semiconductor region;
- a first electrode formed in an opening of the insulating film, the first electrode being formed on an entire surface of the first and second semiconductor regions, the first electrode being formed on only a part of a surface of the further semiconductor region; and
- a second electrode formed on a lower surface of the semiconductor layer.

* * * * *